(12) United States Patent
Mokhlesi et al.

(10) Patent No.: US 7,405,968 B2
(45) Date of Patent: Jul. 29, 2008

(54) NON-VOLATILE MEMORY CELL USING HIGH-K MATERIAL AND INTER-GATE PROGRAMMING

(75) Inventors: Nima Mokhlesi, Los Gatos, CA (US); Jeffrey W. Lutze, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/470,932

(22) Filed: Sep. 7, 2006

(65) Prior Publication Data

US 2007/0025145 A1  Feb. 1, 2007

Related U.S. Application Data

(63) Continuation of application No. 10/762,181, filed on Jan. 21, 2004, now Pat. No. 7,154,779.

(51) Int. Cl.
*G11C 16/04* (2006.01)
(52) U.S. Cl. .................. 365/185.01; 365/185.03; 365/185.18
(58) Field of Classification Search ............ 365/185.01, 365/185.03, 185.18
See application file for complete search history.

(56) References Cited

U.S. PATENT DOCUMENTS

| 4,870,470 | A |   | 9/1989  | Bass, Jr. |
|-----------|---|---|---------|-----------|
| 5,043,940 | A |   | 8/1991  | Harari    |
| 5,095,344 | A |   | 3/1992  | Harari    |
| 5,172,338 | A |   | 12/1992 | Mehrotra  |
| 5,208,772 | A | * | 5/1993  | Kasold et al. .......... 365/185.14 |
| 5,343,063 | A |   | 8/1994  | Yuan      |
| 5,373,465 | A |   | 12/1994 | Chen      |
| 5,570,315 | A |   | 10/1996 | Tanaka    |
| 5,677,872 | A |   | 10/1997 | Samachisa |
| 5,768,188 | A | * | 6/1998  | Park et al. .......... 365/185.03 |
| 5,774,397 | A |   | 6/1998  | Endoh     |
| 5,867,429 | A |   | 2/1999  | Chen      |
| 5,877,980 | A |   | 3/1999  | Mang      |
| 5,890,192 | A |   | 3/1999  | Lee       |
| 5,930,167 | A |   | 7/1999  | Lee       |
| 5,936,887 | A |   | 8/1999  | Choi      |

(Continued)

FOREIGN PATENT DOCUMENTS

| EP | 0105802  | 4/1984  |
|----|----------|---------|
| JP | 59147461 | 8/1984  |
| TW | 00564524 | 12/2003 |

OTHER PUBLICATIONS

Hen-Sheng Lee, "A New Approach for the Floating-Gate MOS Nonvolatile Memory," Applied Physics Letters, vol. 31, No. 7, Oct. 1, 1977, pp. 475-476.*

(Continued)

*Primary Examiner*—Huan Hoang
(74) *Attorney, Agent, or Firm*—Vierra Magen Marcus & DeNiro LLP

(57) ABSTRACT

A non-volatile memory device has a channel region between source/drain regions, a floating gate, a control gate, a first dielectric region between the channel region and the floating gate, and a second dielectric region between the floating gate and the control gate. The first dielectric region includes a high-K material. The non-volatile memory device is programmed and/or erased by transferring charge between the floating gate and the control gate via the second dielectric region.

44 Claims, 15 Drawing Sheets

U.S. PATENT DOCUMENTS

| | | | |
|---|---|---|---|
| 5,990,514 | A | 11/1999 | Choi |
| 6,044,017 | A | 3/2000 | Lee |
| 6,046,935 | A | 4/2000 | Takeuchi |
| 6,074,914 | A | 6/2000 | Ogura |
| 6,093,605 | A | 7/2000 | Mang |
| 6,103,573 | A | 8/2000 | Harari |
| 6,121,654 | A | 9/2000 | Likharev |
| 6,130,838 | A * | 10/2000 | Kim et al. ............ 365/185.17 |
| 6,136,652 | A | 10/2000 | Hazani |
| 6,151,248 | A | 11/2000 | Harari |
| 6,166,951 | A | 12/2000 | Derhacobian |
| 6,172,397 | B1 | 1/2001 | Oonakado |
| 6,222,762 | B1 | 4/2001 | Guterman |
| 6,246,607 | B1 | 6/2001 | Mang |
| 6,448,129 | B1 | 9/2002 | Cho et al. |
| 6,461,905 | B1 | 10/2002 | Wang |
| 6,512,262 | B2 | 1/2003 | Watanabe |
| 6,529,410 | B1 | 3/2003 | Han |
| 6,617,639 | B1 | 9/2003 | Wang |
| 6,624,029 | B2 | 9/2003 | Lojek |
| 6,642,066 | B1 | 11/2003 | Halliyal |
| 6,784,484 | B2 | 8/2004 | Blomme |
| 6,790,782 | B1 | 9/2004 | Yang |
| 6,894,339 | B2 * | 5/2005 | Fan et al. .................. 257/314 |
| 6,943,416 | B2 * | 9/2005 | Hu ............................ 257/412 |
| 7,115,949 | B2 * | 10/2006 | Hoefler et al. ............ 257/350 |
| 7,154,779 | B2 * | 12/2006 | Mokhlesi et al. ....... 365/185.01 |
| 2003/0002348 | A1 | 1/2003 | Chen |
| 2003/0003657 | A1 | 1/2003 | Kim |
| 2003/0042527 | A1 | 3/2003 | Forbes |
| 2005/0138262 | A1 | 6/2005 | Forbes |
| 2006/0245245 | A1 | 11/2006 | Mokhlesi et al. |

OTHER PUBLICATIONS

Borson, et al:, "Direct Measurement of the Energy Distribution of Hot Electrons in Silicon Dioxide," J. Appl. Phys., vol. 58, No. 3.1, Aug. 1985, pp. 1302-1313.

Camm, et al., "Engineering Ultra-Shallow Junctions Using fRTP™," IEEE, Vortek Industries Limited, 2002.

Chan, et al., "A True Single-Transistor Oxide-Nitride-Oxide EEPROM Device," IEEE Electron Device Letters, vol. EDL-8, No. 3, Mar. 1987, pp. 93-95.

Choi, et al., "A Novel Booster Plate Technology in High Density NAND Flash Memories for Voltage Scaling-Down and Zero Program Disturbance," IEEE Symposium on VLSI Technology Digest of Technical Papers, 1996, pp. 238-239.

Choi, et al., "A Triple Polysilicon Stacked Flash Memory Cell With Wordline Self-Boosting Programming", IEEE, 1997, pp. 283-286.

DiMaria, "Graded or Stepped Energy Band-Gap-Insulator MIS Structures (GI-MIS or SI-MIS)," American Institute of Physics, Sep. 1979, pp. 5826-5828.

DiMaria, et al., "Dual-Electron-Injector-Structure Electrically Alterable Read-Only-Memory Modeling Studies," IEEE Transactions on Electron Devices, vol., ED-28, No. 9, Sep. 1981, pp. 1047-1053.

DiMaria, et al., "Electrically-Alterable Memory Using A Dual Electron Injector Structure," IEEE Elelctron Device Letters, vol. EDL-1, No. 9, Sep. 1980, pp. 179-180.

DiMaria, et al., "Extended Cyclability in Electrically-Alterable Read-Only-Memories," IEEE Electron Device Letters, vol. EDL-3, No. 7, Jul. 1982, pp. 191-195.

Hirayama, et al., "Low-Temperature Growth of High-Integrity Silicon Oxide Films by Oxygen Radical Generated in High-Density Krypton Plasma," IEEE, 1999, pp. 10.3.1-10.3.4.

Kim, "An Empirical Model for Charge Leakage Through Oxide-Nitride-Oxide Interpoly Dielectric in Stacked-Gate Flash memory Devices," Semiconductor Science and Technology 18 (2003) pp. 158-162.

Kim, et al., "Fast Parallel Programming of Multi-Level NAND Flash Memory Cells Using the Booster-Line Technology", Symposium on VLSI Technology Digest of Technical Papers, 1997, pp. 65-66.

Likharav, et al. "Riding the Crest of a New Wave in Memory, NOVORAM: A New Concept for Fast, Bit-Addressable Nonvolatile Memory Based on Crested Barriers," Circuits and Devices, Jul. 2000, p. 17.

Kotecha, et al., "WAM 3.2: A Dual-Gate Floating Gate FET Device," IEEE International Solid-State Circuits Conference, 1981, pp. 38-39.

Korotkov, et al., "Resonant Fowler-Nordheim Tunneling through Layered Tunnel Barriers and its Possible Applications," 1999 IEEE, 0-7803-5413-3/99.

Lee, et al., "Effects of Floating Gate Interference on NAND Flash Memory Cell Operation," IEEE Electron Device Letters, vol. 23, No. 5, May 2002, p. 264.

Nozaki, et al., "A 1-Mb EEPROM With NONOS Memory Cell for Semiconductor Disk Application," IEEE Journal of Solid-State Circuits, vol. 26, No. 4, Apr. 1991, pp. 497-501.

Ohmi, et al., "New Paradigm of Silicon Technology," Proceedings of the IEEE, vol. 89, No. 3, Mar. 2001, pp. 394-412.

Satoh, et al., "A Novel Channel Boost Capacitance (CBC) Cell Technology with Low Program Disturbance Suitable for Fast Programming 4Gbit NAND Flash Memories", IEEE Symposium on VLSI Technology Digest of Technical Papers, 1998, pp. 108-109.

Satoh, et al., "A Novel Gate-Offset NAND Cell (GOC-NAND) Technology Suitable for High-Density and Low-Voltage-Operation Flash Memories," Technical Digest of 1999 IEDM, section 11, No. 2, p. 275.

Seidel, et al., "Progress and Challenges for ALD Applications," Genus, Inc., Aug. 5, 2003, pp. 1-39.

Sekine, et al., "Highly Reliable Ultrathin Silicon Oxide Film Formation at Low Temperature by Oxygen Radical Generated in High Density Krypton Plasma," IEEE Transactions on Electron Devices, vol. 48, No. 8, Aug. 2001, pp. 1550-1555.

Suh, et al., "A 3.3V 32Mb NAND Flash Memory With Incremental Step Pulse Programming Scheme," IEEE international Solid-State Circuits Conference, Digest of Technical Papers, Feb. 1995, pp. 94-95, 305-306, 128-129, and 350.

Yu, et al., "Energy gap and band alignment for $(HfO_2)_x(Al_2O_3)_{1-x}$ on (100) Si," Applied Physics Letters, vol. 81, No. 2, Jul. 8, 2002, pp. 376-378.

Brown, Nonvolatile Semiconductor Memory Technology, A Comprehensive Guide to Understanding and Using NVSM Devices, Sep. 1997, pp. 198-200.

Buckley, Engineering of 'Conduction Band-Crested Barriers' 'Dielectric Constant-Crested Barriers' in view of their application to floating-gate non-volatile memory devices, Dec. 2002, pp. 55-56.

Dijkstra, et al., "ISSG RTO (In-situ Steam Generation Rapid Thermal Oxidation) Grown Tunnel Oxide for Improved Reliability of Flash Memories," Phillips Semiconductors, Dec. 2002, pp. 85-86.

Ohtsubo, et al., "Low Temperature Growth (400°C of High-Integrity Thin Silicon-Oxynitride Films by Microwave-Excited high-Density $Kr/O_2/NH_3$ Plasma," Electrical and Electronics Engineers in Israel, 2002. the 22nd Convention of, Dec. 1, 2002, pp. 166-169.

Office Action dated Nov. 9, 2007, U.S. Appl. No. 11/427,908, filed Jun. 30, 2006.

Taiwan Search Report dated Jul. 16, 2007, Taiwan Patent Application No. 094101828.

English Abstract for Taiwan Patent No. TW564524, Dec. 01, 2003.

Response to Office Action dated Feb. 7, 2008, U.S. Appl. No. 11/427, 908, filed Jun. 30, 2006.

Office Action dated Apr. 17, 2008, U.S. Appl. No. 11/427,908, filed Jun. 30, 2006.

* cited by examiner

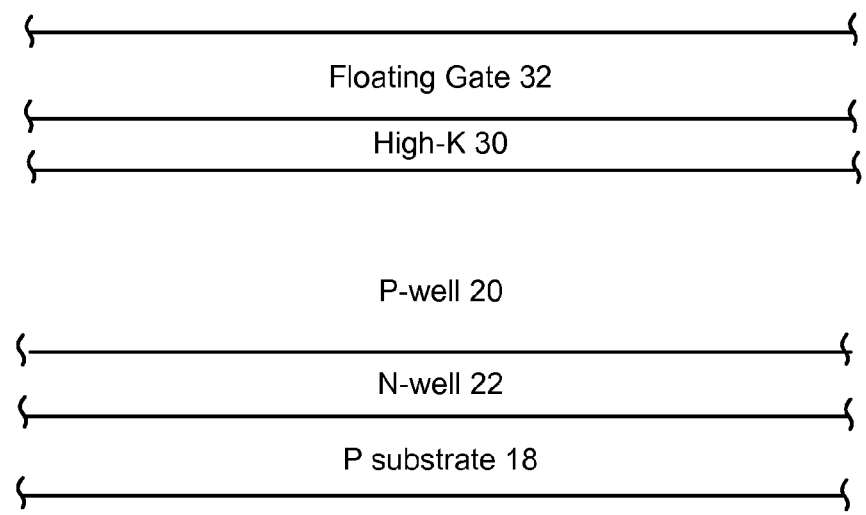
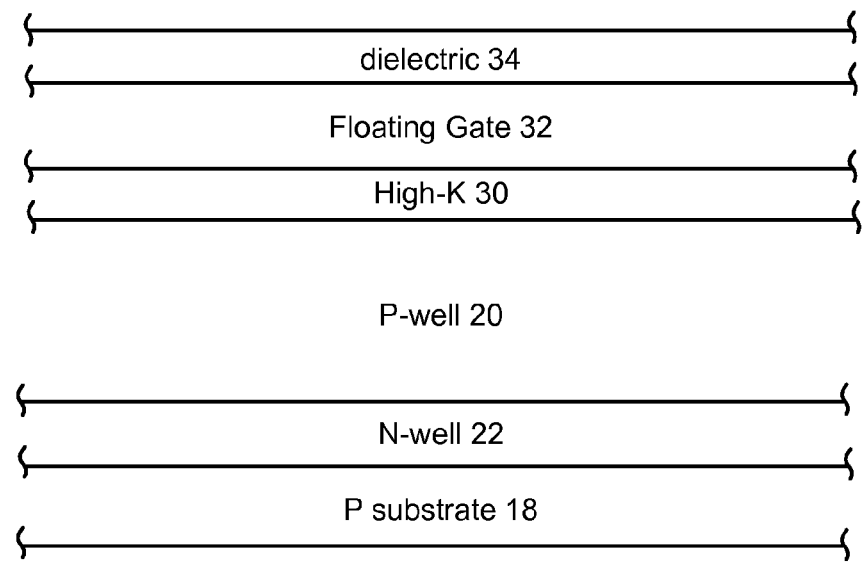

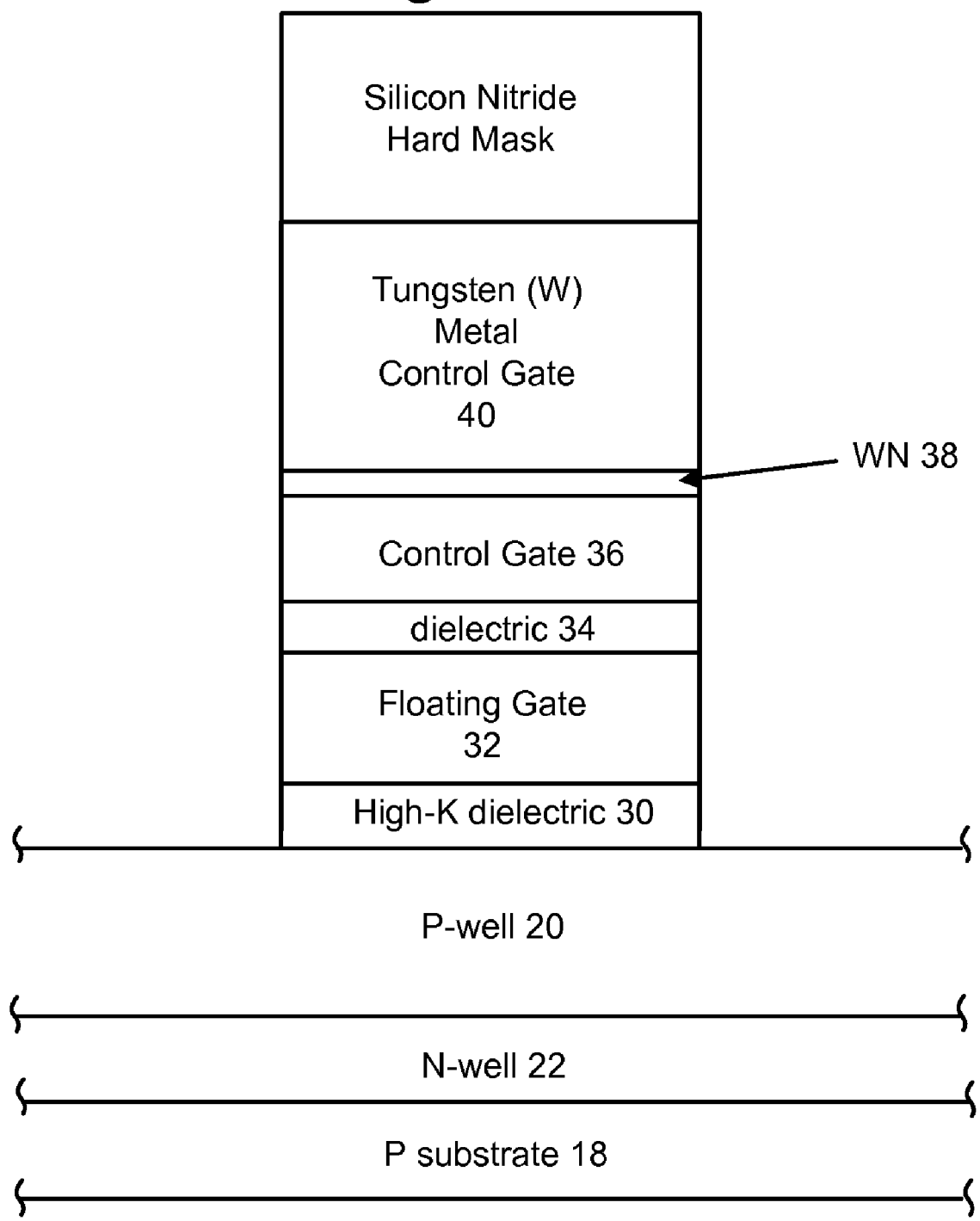

NON-VOLATILE MEMORY CELL USING HIGH-K MATERIAL AND INTER-GATE PROGRAMMING

CLAIM OF PRIORITY

This application claims the benefit of and is a continuation of U.S. application Ser. No. 10/762,181, "Non-Volatile Memory Cell Using High-K Material and Inter-Gate Programming," by Mokhlesi, et al., filed Jan. 21, 2004, now U.S. Pat. No. 7,154,779, incorporated herein by reference.

BACKGROUND OF THE INVENTION

1. Field of the Invention

The present invention relates to non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Typical EEPROMs and flash memories utilize a memory cell with a floating gate that is provided above a channel region in a semiconductor substrate. The floating gate is separated from the channel region by a dielectric region. For example, the channel region is positioned in a p-well between source and drain regions. A control gate is provided over and separated from the floating gate. The threshold voltage of the memory cell is controlled by the amount of charge that is retained on the floating gate. That is, the level of charge on the floating gate determines the minimum amount of voltage that must be applied to the control gate before the memory cell is turned on to permit conduction between its source and drain.

Some EEPROM and flash memory devices have a floating gate that is used to store two ranges of charges and, therefore, the memory cell can be programmed/erased between two states (e.g. a binary memory cell). A multi-bit or multi-state flash memory cell is implemented by identifying multiple, distinct threshold voltage ranges within a device. Each distinct threshold voltage range corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. To achieve proper data storage for a multi-state cell, the multiple ranges of threshold voltage levels should be separated from each other by sufficient margin so that the level of the memory cell can be read, programmed or erased in an unambiguous manner.

When programming typical prior art EEPROM or flash memory devices, a program voltage is applied to the control gate and the bit line is grounded. Electrons from the channel are injected into the floating gate. When electrons accumulate in the floating gate, the floating gate becomes negatively charged and the threshold voltage of the memory cell as seen from the control gate is raised.

Typically, the program voltage Vpgm applied to the control gate is applied as a series of pulses. The magnitude of the pulses is increased with each successive pulse by a predetermined step size (e.g. 0.2 v). In the periods between the pulses, verify operations are carried out. That is, the programming level of each cell of a group of cells being programmed in parallel is read between each programming pulse to determine whether it is equal to or greater than each individual cell's targeted verify level to which it is being programmed. One means of verifying the programming is to test conduction at a specific compare point. The cells that are verified to be sufficiently programmed are locked out, for example, by raising the bit line voltage from 0 to Vdd to stop the programming process for those cells. The above described programming technique, and others described herein, can be used in combination with various self boosting techniques, for example, as described in U.S. patent application Ser. No. 10/379,608, titled "Self Boosting Technique," filed on Mar. 5, 2003, incorporated herein by reference in its entirety. Additionally, an efficient verify technique can be used, such as described in U.S. patent application Ser. No. 10/314,055, "Smart Verify for Multi-State Memories," filed Dec. 5, 2002, incorporated herein by reference in its entirety.

Typical prior art memory cells are erased by raising the p-well to an erase voltage (e.g. 20 volts) and grounding the control gate. The source and drain are floating. Electrons are transferred from the floating gate to the p-well region and the threshold voltage is lowered.

There is a trend to make smaller and smaller non-volatile memory devices. As devices become smaller, it is anticipated that the cost per bit of a memory system will be reduced. As the channel size is reduced, the capacitive coupling between the channel and the floating gate needs to be increased in order to maintain the gate's influence over the channel. One way to achieve this is to reduce the effective thickness of the dielectric region between the channel and the floating gate. Thinner effective gate oxide thicknesses will maintain the dominance of the gate to channel capacitance over other parasitic capacitances to the channel such as those of the drain, source and substrate. Otherwise, the source, drain, and/or substrate (i.e. P-well region for N-channel devices fabricated in a triple well) regions will have too much influence over the channel. However, if the thickness of the channel dielectric region becomes too small, the electric field from a charged floating gate can cause electrons to leak from the floating gate across the channel dielectric region and into the channel, source, or drain. In some cases, if the dielectric region is not thick enough, direct tunneling occurs when no tunneling is desired. Thus, there is a need to shrink device size of non-volatile memory devices, without suffering from the effects of thin dielectric regions.

SUMMARY OF THE INVENTION

The present invention, roughly described, pertains to non-volatile memory devices, including EEPROMS, flash memory and other types of non-volatile memory. One embodiment of the non-volatile memory device includes a channel region between source/drain regions, a floating gate, a control gate, a first dielectric region between the channel region and the floating gate, and a second dielectric region between the floating gate and the control gate. The first dielectric region includes a high-K material (and, maybe, other materials). When operating one embodiment of the above described non-volatile memory device, the non-volatile memory device is programmed and/or erased by transferring charge between the floating gate and the control gate via the second dielectric region (i.e. the inter-gate dielectric region). In one example implementation, the non-volatile memory device is programmed and/or erased by tunneling between the floating gate and the control gate via the second dielectric region.

In one embodiment of the present invention, the non-volatile storage device is a flash memory device (e.g. binary flash memory device or multi-state flash memory device). In other embodiments, the device is a different type of non-volatile memory device.

One or more of the non-volatile memory devices can be used in a system that includes a control circuit for operating the non-volatile memory devices. For example, a control circuit can include (individually or in combination) a controller, a state machine, decoders, drivers, sense amplifiers, other logic, subsets of the above and/or combinations of the above.

These and other objects and advantages of the present invention will appear more clearly from the following description in which the preferred embodiment of the invention has been set forth in conjunction with the drawings.

BRIEF DESCRIPTION OF THE DRAWINGS

FIGS. 10A-F depict the non-volatile memory device of FIG. 1 at various stages of the process described in FIG. 9.

DETAILED DESCRIPTION

Figure 1:
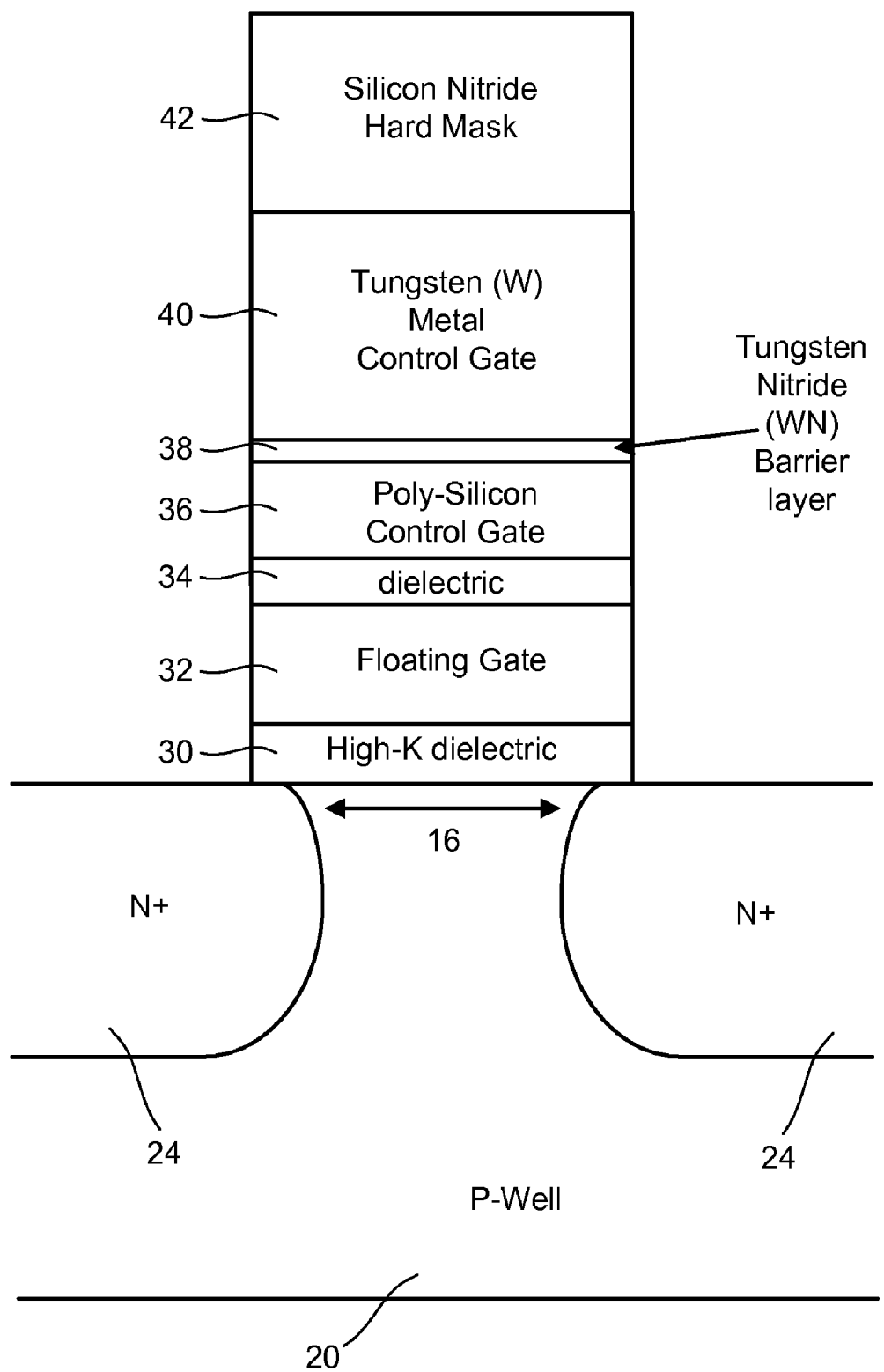
FIG. 1 is a two-dimensional block diagram of one embodiment of a flash memory cell according to the present invention.

FIG. 1 is a two-dimensional block diagram of one embodiment of a flash memory cell according to the present invention. Although a flash memory cell is discussed, other types of non-volatile memory can also be used in accordance with the present invention. The memory cell of FIG. 1 includes a triple well comprising a P substrate, a N-well and a P-well 20. The P substrate and the N-well are not depicted in FIG. 1 in order to simplify the drawing; however, they are depicted in another drawing described below. Within P-well 20 are N+ diffusion regions 24, which serve as source/drains. Whether N+ diffusion regions 24 are labeled as source regions or drain regions is somewhat arbitrary; therefore, the N+ diffusion source/drain regions 24 can be thought of as source regions, drain regions, or both.

Between N+ diffusion regions 24 is the channel 16. Above channel 16 is dielectric area 30. Above dielectric area 30 is floating gate 32. The floating gate, under low voltage operating conditions associated with read or bypass operations, is electrically insulated/isolated from channel 16 by dielectric area 30. Above floating gate 32 is dielectric area 34. Above dielectric area 34 is a poly-silicon layer of control gate 36. Above poly-silicon layer 36 is a conductive barrier layer 138 made of Tungsten Nitride (WN). Above barrier layer 138 is a low resistivity metal gate layer 40 made of Tungtsen. WN layer 38 is used to reduce the inter-diffusion of Tungsten into the poly-silicon layer of control gate 36, and also of silicon into Tungsten layer 40. Note that, in one embodiment, control gate 36 consists of layers 36, 38, and 40 as they combine to form one electrode. In other embodiments, a single metal layer, or multiple metal layers without using a poly control gate sub-layer 36 can be used. Dielectric 30, floating gate 32, dielectric 34, poly-silicon layer of control gate 36, WN layer 38 of control gate, and Tungsten metal layer 40 of control gate comprise a stack. An array of memory cells will have many such stacks.

Various sizes and materials can be used when implementing the memory cell of FIG. 1. In one embodiment, dielectric 30 is 14 nm and includes a high-K material. In other embodiments, dielectric 30 can be 8 nm-15 nm. Examples of high-K materials that can be used in dielectric 30 include Aluminum Oxide $Al_2O_3$, Hafnium Oxide $HfO_2$, Hafnium Silicate $HfSiO_X$, Zirconium Oxide, or laminates and/or alloys of these materials. Other high-K materials can also be used.

Use of high-K dielectric materials between the crystalline silicon channel, and a poly gate typically creates two interfacial layers above and below the high-K material itself. These interfacial layers are composed of $SiO_2$, or Silicon Oxynitride (SiON), with some fraction of metal atoms that may have diffused from the high-K material itself. These interfacial layers are usually formed naturally and not intentionally, and in many applications these interfacial layers are undesirable, as their dielectric constant tends to be substantially lower than the dielectric constant of the high-K material. In the present application, because the high-K dielectric is substantially thicker than that used for gate dielectrics of advanced MOS logic transistors, an interfacial layer that is 1 nm thick or even thicker may not only be tolerable, but also a welcome feature. This will especially be the case if the lower K interfacial layer provides higher mobility for channel electrons, and/or higher immunity to leakage currents because of the higher energy barrier (bottom of the conduction band offset) that the interfacial layer may offer. Higher energy barriers reduce the possibility of electron injection into the high-K dielectric by both direct tunneling, and Fowler-Nordheim (FN) tunneling. Silicon nitride or other inter-diffusion barrier insulators and oxygen diffusion barrier insulators may also be deposited or grown at the interface of silicon and high-K material in order to impede inter-diffusion of various atoms across material boundaries and/or impede further growth of interfacial silicon oxide layers. Toward these ends, in some embodiments, layers of silicon oxide and/or silicon nitride may be intentionally grown and/or deposited to form part of the interfacial layers above and/or below the high-K dielectric(s).

Floating gate 32 is 20 nm and is typically made from poly-silicon that is degenerately doped with n-type dopants; however, other conducting materials, such as metals, can also be used. Dielectric 34 is 10 nm and is made of SiO$_2$; however, other dielectric materials can also be used. Control gate sub layer 36 is 20 nm and is made from poly-silicon; however, other materials can also be used. The WN conducting diffusion barrier layer 38 is 4 nm thick. Tungsten metal control gate layer 40 is 40 nm thick. Other sizes for the above described components can also be implemented. Additionally, other suitable materials, such as replacing W/WN with Cobalt Silicide, can also be used. The floating gate and the control gate can also be composed of one or more layers of poly-silicon, Tungsten, Titanium, or other metals or semiconductors.

As mentioned above, dielectric 30 includes a high-K material. A "high-K material" is a dielectric material with a dielectric constant K greater than the dielectric constant of silicon dioxide. The dielectric constant K of silicon dioxide is in the range 3.9 to 4.2. For the same actual thickness, a high-K material will provide more capacitance per unit area than silicon dioxide (used for typical dielectric regions). In the background discussion above, it was stated that as channel size becomes smaller, the thickness of the dielectric region between the channel and the floating gate should be reduced. What is learned is that it is the effective thickness that must be reduced because it is the effective thickness that determines the control of the floating gate over the channel. Effective thickness is determined as follows:

$$EffectiveThickness = \frac{ActualThickness}{actualK / SiliconDioxideK}$$

where Actual Thickness is the physical thickness of the dielectric region, actualK is the dielectric constant for the material used in the dielectric region and SiliconDioxideK is the dielectric constant for SiO$_2$.

A high-K material will have an effective thickness that is lower than its actual thickness. Therefore, a high-K material can be used with a smaller channel size. The smaller effective thickness accommodates the smaller channel size, allowing the gate to maintain the appropriate influence over the channel. The larger actual thickness of a high-K material helps prevent the leakage discussed above.

In one embodiment, the programming and erasing is performed by transferring charge between floating gate 32 and control gate 36, across dielectric 34. This is advantagous because the programming mechanism (e.g. tunneling) is now not so burdened with strong coupling. Rather, the strong steering function is placed between the floating gate and the channel, matching the strong channel coupling dictate for scaled channels. Thus, the memory cell of FIG. 1 has interchanged dielectric roles. Namely, a high-K dielectric and associated steering function placed between floating gate 32 and channel 16, and non-scaled down tunnel oxide (e.g. ~>85 Å, targeted towards high reliability, minimal leakage current) between control gate 36 and floating gate 32. Thus, in some embodiments, dielectric 34 serves as the tunnel oxide.

Some advantages which may be realized with some embodiments of the above described memory cell includes the ability to properly scale the device; wear associated with program/erase can be confined to the inter-gate region (away from the channel), which can increase endurance; lower program/erase voltages and/or higher reliability by using thicker dielectrics; and the elimination of the need to aggressively scale tunnel oxide of traditional NAND (or flash memories with other architectures such as NOR). A designer of a memory cell according to the present invention should be mindful of GIDL and a lower control gate coupling ratio (less Q$_{fg}$, stronger magnification of channel noise and larger manifestations of cell-to-cell variations).

Figure 2:
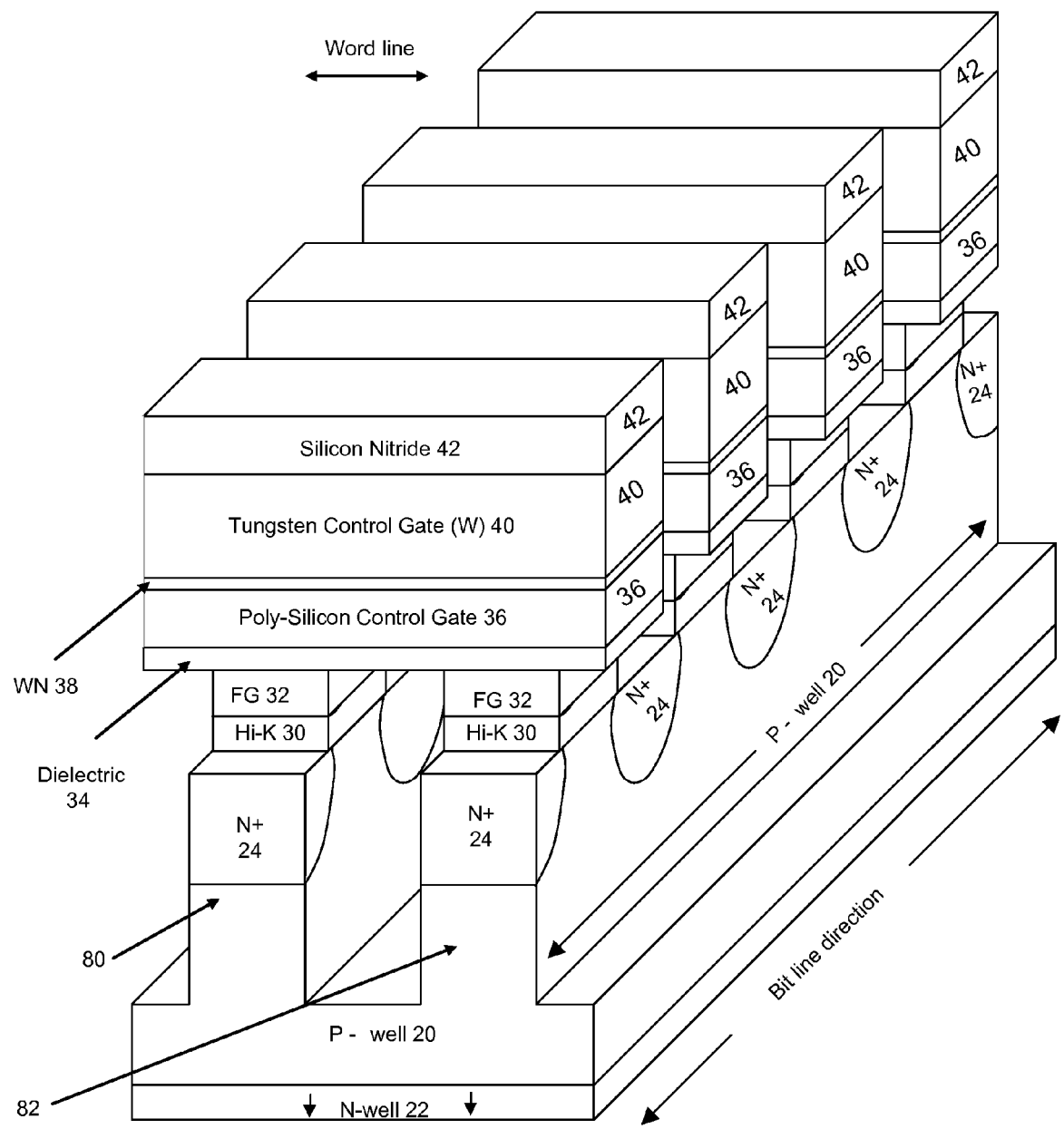
FIG. 2 is a three dimensional drawing of a pair of four word line long portions of two NAND strings according to one embodiment of the present invention.

In one embodiment, the memory cell of FIG. 1 is a NAND type flash memory cell. In other embodiments, other types of flash memory cells can be used. FIG. 2 is a three dimensional drawing of two NAND strings 80 and 82 according to one embodiment of the present invention. FIG. 2 depicts four memory cells on strings 80 and 82; however, more or less than four memory cells can be used. For example, typical NAND strings consist of 16, 32 or 64 NAND cells in series. Other sizes of NAND strings can also be used with the present invention. Each of the memory cells has a stack as described above with respect to FIG. 1. FIG. 2, further depicts N-well 22 below P-well 20, the bit line direction along the NAND string and the word line direction perpendicular to the NAND string. The P-type substrate below the N-well is not shown in the FIG. 2. In one embodiment, the control gates form the word lines. In another embodiment, the control gate poly-silicon layer 36, WN layer 38 and Tungsten layer 40 form the word lines or control gates. In many embodiments, a Silicon Nitiride layer 42 is above the Tungsten layer 40, and serves as a hard mask for etching the multiple gate stacks to form individual word lines. Another purpose of the nitride (or other material) hard mask is to provide a thickening of the spacers that are formed on the side walls of the stacks by moving the thinning regions of the spacers further away from the control conducting word lines and placing the thinning portions of the spacers vis-à-vis the nitride hard mask residing on top of the upper-most control gate sub-layer (see the thinning of the spacers depicted in FIG. 3).

Figure 3:
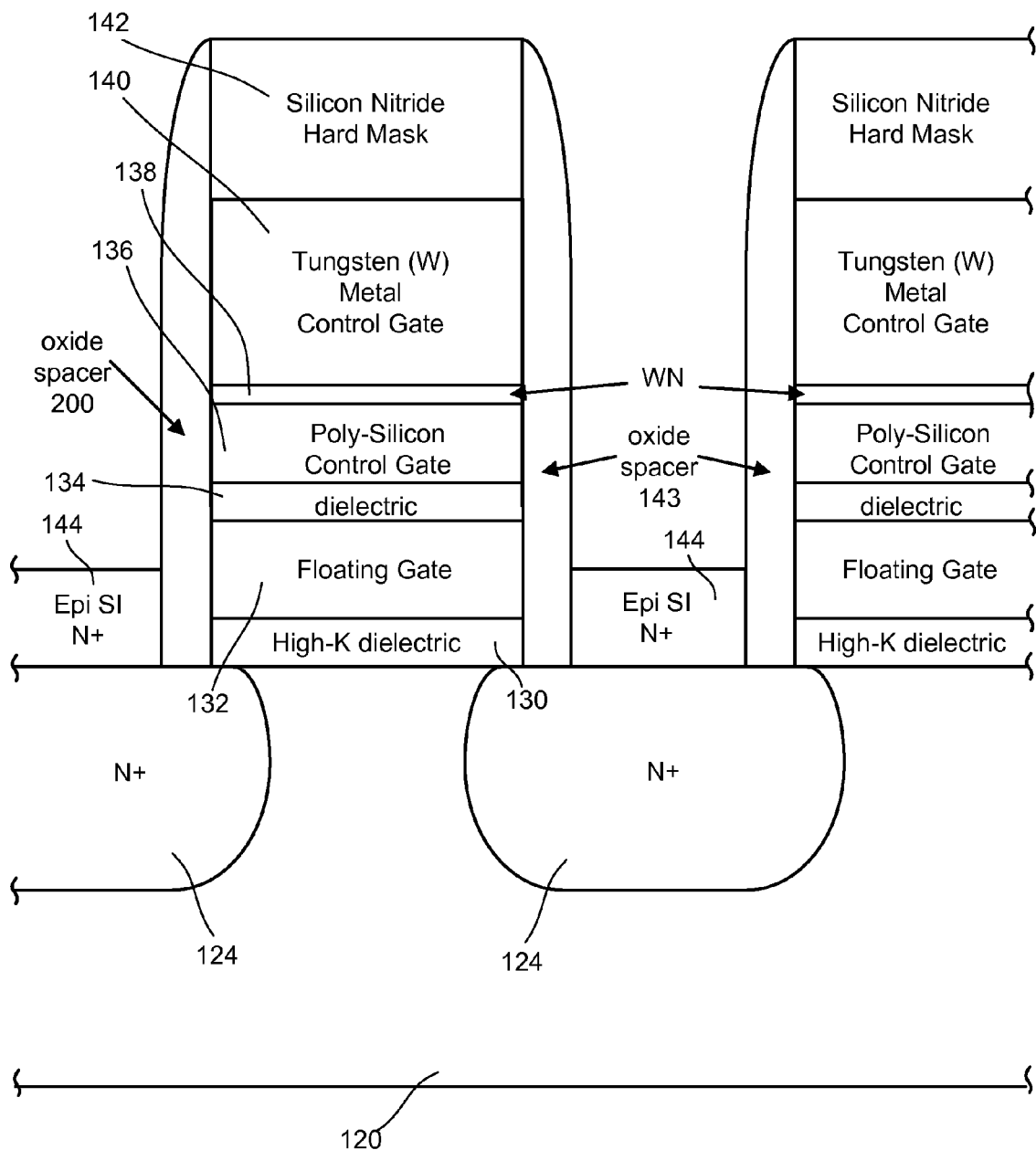
FIG. 3 is a two-dimensional block diagram of a second embodiment of a flash memory cell according to the present invention.

FIG. 3 depicts a second embodiment of a memory cell. The memory cell of FIG. 3 includes a triple well comprising a P substrate, a N-well and a P-well 120. The P substrate and the N-well are not depicted in FIG. 3 in order to simplify the drawing. Within P-well 120 are N+ diffusion regions 124, which serve as source/drains. Between N+ diffusion regions 124 is the channel 116. Above the channel is dielectric area 130. Above dielectric area 130 is floating gate 132. Above floating gate 132 is dielectric area 134. Above dielectric area 134 is control gate composed of poly-silicon layer 136, conductive barrier layer 138 made of Tungsten Nitride (WN), and a low resistivity layer 140 made of Tungtsen. Above the low resistivity layer 140 made of Tungtsen is a hard mask 42 that is made, for example, of Silicon Nitride. P-well 120, N+ diffusion regions 124, dielectric 130, floating gate 132, dielectric 134, control gate 136, WN layer 138, Tungsten layer 140 and hard mask 142 are similar to that of FIG. 1.

Dielectric 130, floating gate 132, dielectric 134, poly-silicon 136, WN layer 138, Tungsten layer 140, and hard mask Silicon Nitride (Si$_3$N$_4$) layer 142 form a stack. The memory cell of FIG. 3 also includes oxide spacers 143 along the sides of the stack. In one embodiment, oxide spacers 143 are tapered so that they are thinner at the top of Silicon Nitride (Si$_3$N$_4$) layer 142 than they are at dielectric 130. In another embodiment, the entire stack, including oxide spacers 143, are trapezoidal (tapered toward the top), which helps the dielectric 130 provide more coupling in comparison to dielectric 134 which would form a smaller area capacitor due to the trapezoidal shape of the stack. A cross section of such an embodiment is depicted in FIG. 4A, and discussed below. The ratio of the areas of the bottom dielectric 130 to the top dielectric 134 increases with the thickness of the floating gate 132 for a fixed tapered angle.

In some embodiments, between oxides spacers of neighboring stacks are epitaxially grown silicon regions 144 (e.g., positioned over N+ diffusion regions 124). The utilization of such epitaxially grown raised source/drain regions obviates the implanted source/drain regions underneath them, increasing the effective channel length of the device in keeping with the dictates of proper scaling of MOS devices. This reduces punch through and improves the sub-threshold swing of the NAND devices. The issues arising from offset source/drain diffusion regions that degrade the endurance characteristics of standard NAND device should not arise here as the tunneling and the associated charge trapping have been moved from the channel dielectric to the inter-gate dielectric. The epitaxially grown silicon regions 144 also provides extra capacitance between the floating gate and the channel/source/drain, reducing the high voltage requirements for program and erase operations. It is desired to have the floating gate more capacatively coupled to the channel than the control gate. In some implementations, there is a goal to maximize the voltage drop across dielectric 134 and have less of a voltage drop across dielectric 130. By using the high-K material in dielectric 130 in combination with the epitaxially grown silicon regions 144, the coupling between floating gate 132 and channel 166 is increased. Yet another benefit derived from epitaxially grown source/drain regions is their capability to reduce the capacitive coupling between neighbor floating gates on neighbor word lines by shielding these floating gates from one another. This effect is a major problem resulting in eroded threshold sensing margins. This effect was first published in May 2002 issue of IEEE Electron Device Letters, Vol. 23, No. 5, page 264 by Jae-Duk Lee, et. al. in an article titled: "Effects of Floating Gate Interference on NAND Flash Memory Cell Operation". Also see U.S. Pat. Nos. 5,867,429 and 5,930,167, which patents are incorporated herein by reference in their entirety.

The article titled "A Novel Gate-Offset NAND Cell (GOC-NAND) Technology Suitable for High-Density and Low-Voltage-Operation Flash Memories" by Shinji Satoh, et. al. published in the Technical Digest of 1999 IEDM (section 11, number 2, page 275) discusses the issue of parasitic cells formed in the off-set region of GOC-NAND devices that impact the cycling endurance of cells through trap-up occurring in the oxide residing above these parasitic cells. While this is a serious issue plaguing the conventional implementation of GOC-NAND, the gate-offset embodiments of the present invention should not suffer from this issue because the tunneling action should be confined to the inter-gate dielectric.

Figure 4:
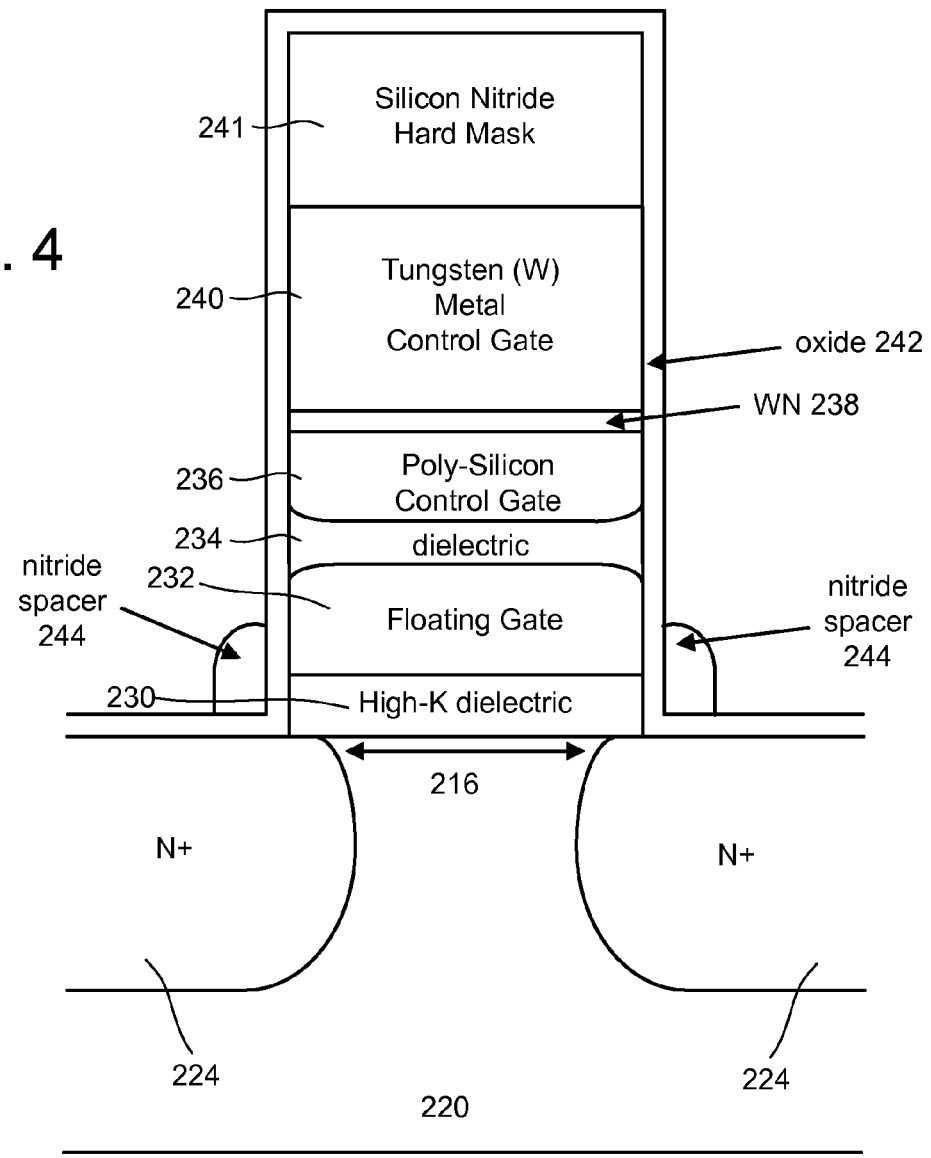
FIG. 4 is a two-dimensional block diagram of a third embodiment of a flash memory cell according to the present invention.
Figure 4A:
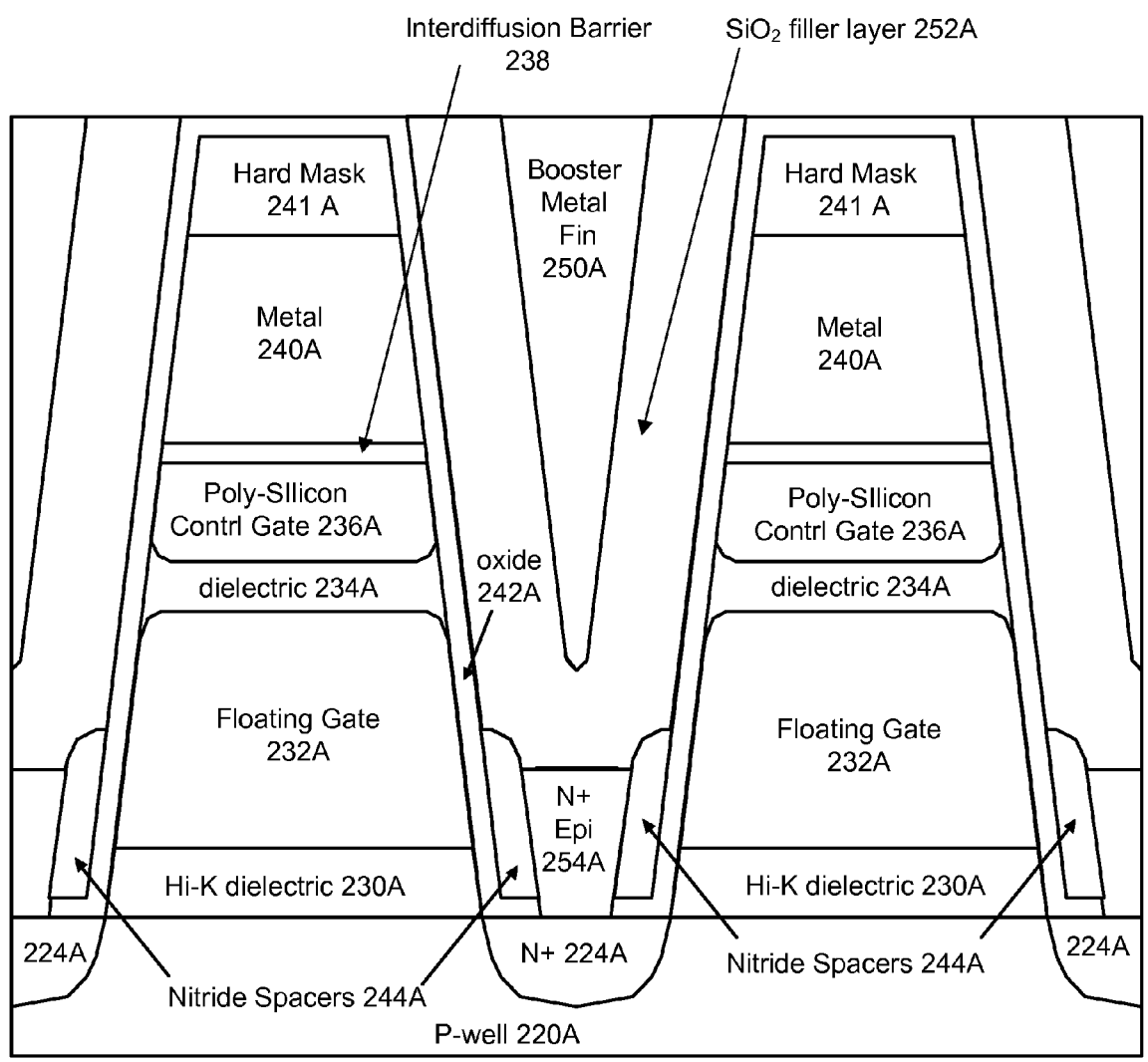
FIG. 4A is a two-dimensional block diagram of a fourth embodiment of a flash memory cell according to the present invention.

FIG. 4 depicts another embodiment of a memory cell according to the present invention. The memory cell of FIG. 4 includes a triple well comprising a P substrate, a N-well and a P-well 220. The P substrate and the N-well are not depicted in FIG. 4 in order to simplify the drawing. Within P-well 220 are N+ diffusion regions 224, which serve as source/drains. Between N+ diffusion regions 224 is the channel 216. Above the channel is the channel dielectric 230. Above channel dielectric 230 is floating gate 232. Above floating gate 232 is inter-gate dielectric 234. Above inter-gate dielectric 234 is control gate composed of poly-silicon 236, the inter-diffusion barrier layer 238 made of Tungsten Nitride (WN), and the low resistivity metal layer 240 made of Tungtsen. P-well 220, N+ diffusion regions 224, dielectric 230, floating gate 232, dielectric 234, control gate 236, WN layer 238 and Tungsten layer 240 are similar to that of FIG. 1.

High-K channel dielectric 230, floating gate 232, inter-gate dielectric 234, lower control gate 236, WN barrier layer 238 and Tungsten layer 240 form a stack. The memory cell of FIG. 4 also includes a 1 nm to 8 nm thick deposited oxide layer 242 surrounding the top and sides of the stack, as well as covering the source/drain diffusion regions. Along the sides of the stack, adjacent and outside of oxide layer 242, are spacers 244. The spacers can be of varying height. In one embodiment, spacers 244 are high enough to be adjacent dielectric 230 and part of the floating gate 232. In some embodiments, the spacers are naturally tapered so that the width of spacers 244 are narrower near the top of floating gate 232 than the width of the spacers near the bottom of dielectric 230. Spacers are generally created by isotropically depositing the material that is to form the spacer, and then anisotrpically etching the material away, leaving only the naturally tapered spacers on the sidewalls of the preexisting steps. Spacers 244 serve to prevent the bottom of the floating gate from being rounded by oxidation. In one embodiment, the spacers are made of Silicon Nitride; however, other materials can also be used.

FIG. 4A illustrates an embodiment with trapezoidally formed stacks. The memory cell of FIG. 4A includes a triple well comprising a P substrate, a N-well and a P-well 220A. The P substrate and the N-well are not depicted in FIG. 4A in order to simplify the drawing. Within P-well 220A are N+ diffusion regions 224A, which serve as source/drains. Between N+ diffusion regions 224A is the channel. Above the channel is the channel dielectric 230A, which includes a high-K material. Above dielectric 230A is floating gate 232A. Above floating gate 232A is inter-gate dielectric 234A. Above inter-gate dielectric 234A is control gate composed of poly-silicon layer 236A, the inter-diffusion barrier layer 238A made of Tungsten Nitride (WN), and the low resistivity metal layer 240A made of Tungtsen. Above Tungsten layer 240A is a hard mask 242A.

Dielectric 230A, floating gate 232A, inter-gate dielectric 234A, lower control gate 236A, WN barrier layer 238A and Tungsten layer 240A form a stack that is trapezoidal in shape (tapered toward the top), which helps the dielectric 230A provide more coupling to the floating gate as compared to the control gate coupling to the floating gate.

The memory cell of FIG. 4A also includes a 1 nm to 8 nm thick deposited oxide layer 242A surrounding the top and sides of the stack, as well as partially covering the source/drain diffusion regions. Along the sides of the stack, adjacent and outside of oxide layer 242A, are spacers 244A. The spacers can be of varying height. In one embodiment, spacers 244A are high enough to be adjacent dielectric 230A and part of the floating gate 232A. The spacers are naturally tapered so that the width of spacers 244A are narrower near the top of floating gate 232A than the width of the spacers near the bottom of dielectric 230A. In one embodiment, the spacers are made of Silicon Nitride, although other materials can also be used. Between the spacers 224A are epitaxially grown silicon regions 254A.

Above epitaxially grown silicon regions 144 and between the stacks is a SiO2 filler layer 252A. Above SiO2 filler layer 252A and also between the stacks is a booster fin 250A. In one embodiment, booster fin 250A is made of a metal, for example, Tungsten.

A booster fin is a variation of a booster plate. Booster plates are made of metal layers that usually wrap around word line stacks and provide isolation for floating gate to floating gate capacitive interference effects. They can be manufactured in a connected form, covering the entire memory array, or be broken up into distinct electrodes with each individual electrode covering a single plane of memory, covering a single erase block, or covering a few erase blocks. Additional relevant background information can be found in U.S. Pat. Nos. 5,877,980; 6,093,605; 6,246,607; 5,990,514; 6,044,017; 5,936,887; Choi et al., "A Novel Booster Plate Technology in High Density NAND Flash Memories for Voltage Scaling-Down and Zero Program Distrubance", IEEE Symposium on VLSI Technology Digest of Technical Papers, 1996, pp. 238-239; Kim et al., "Fast Parallel Programming of Multi-Level NAND Flash Memory Cells Using the Booster-Line Technology", Symposium on VLSI Technology Digest of Technical Papers, 1997, pp. 65-66; Choi et al., "A Triple Polysilicon Stacked Flash Memory Cell With Wordline Self-Boosting Programming", IEEE, 1997, pp. 283-286; and Satoh et al., "A Novel Channel Boost Capacitance (CBC) Cell Technology with Low Program Disturbance Suitable for Fast Programming 4 Gbit NAND Flash Memories", IEEE Symposium on VLSI Technology Digest of Technical Papers, 1998, pp. 108-109; all of which are incorporated herein by reference. One embodiment of the FIG. 4A device would use booster plates instead of booster fins.

Booster fins are similar to booster plates, except that they only consist of fins that are placed between stacks within the memory array, and the fins can be electrically connected to each other in the shunt areas of the array. Shunt areas consist of breaks in the memory array that run in the direction of the bit lines and occur at a frequency of once every few hundred bit lines. A shunt area separates two neighboring bit lines from one another. While booster plates cover the top of all word lines, booster fins do not cover the top of word lines. One embodiment would allocate a single, isolated booster fin or plate to each erase block.

In some embodiments, the individual booster fins or blocks are driven by an NMOS device to drive them to positive voltages and a PMOS device to drive them to high negative voltages. In some embodiments a fixed negative voltage of, for example, −5V is applied to booster fins or plates during read and verify operations with the objective of bringing some of the otherwise negative range of cell threshold voltages into the positive range which then become measurable by control gates which can only take positive voltage values. In some other embodiments the booster fins or plates will have the same voltage as the selected word lines for read operations. The advantage of these embodiments is that the control gate to floating gate coupling ratio for read and verify operations is enhanced by booster plates or fins to floating gate coupling ratio. The effects of threshold voltage variations due to dopant fluctuation or geometric variations, and 1/f noise or random telegraph signal (RTS) noise that are a result of trapping and de-trapping of charges into interface and deeper trap sites are magnified by the inverse of the control gate coupling ratio when the cell's threshold voltage is measured from the control gate. In this sense a high control gate coupling ratio is desirable. However, a low control gate coupling ratio is desirable because it allows inter-gate program and erase operations to be accomplished at substantially lower voltages. Therefore, for program and erase operations, it may be advantagous to apply as high a voltage as may be possible in the opposite direction or polarity as the word lines. For example, in order to program, 15V may be applied to the word line while the P-well, and the channel are at or near zero volts. The floating gate may be at a voltage in the range 3V to 6V depending on how much charge is on it. A grounded booster plate or fin will couple down the floating gate and make it easier to program. An added advantage is that a booster plate or fin that is at a lower voltage than the floating gate will tend to inhibit edge dominated tunneling and, thus, provide a more uniform tunneling behavior without having to utilize high temperature side wall oxidation in order to round the floating gate corners.

In the embodiment of FIG. 4, the top edges of floating gate 232 and the bottom edges of control gate 236 are rounded to provide more uniform tunneling between them.

Note that the embodiments of FIGS. 1, 3, 4 and 4A have some different features. Some of these different features of the different embodiments (as well as other features) can be combined to form additional embodiments within the scope of the present invention.

Also note that the memory cells of 1, 3, 4 and 4A include one floating gate per memory cell. In other embodiments, more than one floating gate per memory cell can be used.

The memory cells of FIGS. 1-4A are programmed by transferring charge from the floating gate to the control gate. In one embodiment, electrons will tunnel from the floating gate to the control gate via Fowler-Nordheim tunneling. In other embodiments, other mechanisms can be used.

The memory cells described in FIGS. 1-4A are to be distinguished in their program and erase characteristics from that of prior art NAND devices. In prior art devices the control gate attempts to tightly couple to the floating gate and control its potential with respect to the substrate, causing electrons to tunnel from floating gate to substrate when the floating gate is sufficiently negative with respect to the substrate (erase; control gate held at ground, substrate raised to high voltage), or to tunnel from the substrate to the floating gate when the floating gate is sufficiently positive with respect to the substrate (program; substrate held at ground, control gate raised to a variable high voltage). Since the substrate is in common with many memory cells, it is convenient to apply a high fixed voltage to it, but it is not convenient to apply a variable low or negative voltage to a common word line connecting multiple control gates, and thereby selectively control the degree of electron removal from these different cells. Thus the "erase" condition is used to refer to removal of substantially "all" electrons from a collection of cells, setting all of them to a common low threshold state, typically a negative value. The erase of multiple cells is then followed by a variable program cycle that can be terminated on a cell by cell basis to set each cell to a unique state while continuing to program other cells on the same word line to a different state, as described earlier.

In the present devices the substrate is tightly coupled to the floating gate via the high dielectric constant material and the control gate is relatively weakly coupled to the floating gate so that reversing the polarity of the definition of erase and program is convenient. That is, when the substrate is raised to a high potential, the floating gate is also raised to a relatively high potential, and many electrons are transferred to the floating gate by tunneling from a grounded control gate, resulting in the collection of cells having a high threshold as viewed from the control gate. Programming, or setting a variable threshold to represent the data state, is accomplished by selectively removing some electrons by raising the control gate in a controlled fashion and terminating the electron removal on a cell by cell basis. This results in selectively reducing the threshold voltage as seen from the control gate, in direct contrast to the prior art devices. This will be described more completely below in conjunction with FIGS. 6-8.

Figure 5:
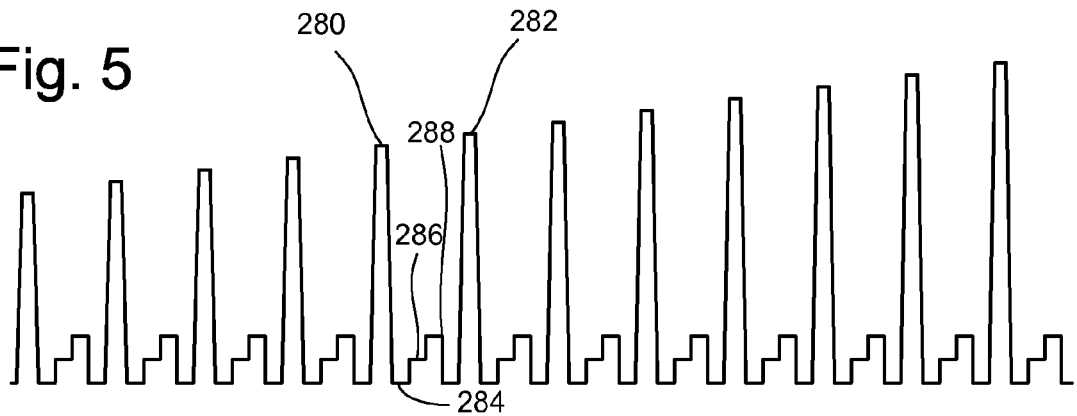
FIG. 5 depicts a program/verify voltage signal applied to a selected word line.

In one example, the drain and the p-well will receive 0 volts while the control gate receives a set of programming pulses with increasing magnitudes, such as depicted in FIG. 5. In one embodiment, the magnitudes of the pulses range from 7 volts to 15 volts. In other embodiments, the range of pulses can be different. During programming of a memory cell, verify operations are carried out in the periods between the pulses. That is, the programming level of each cell of a group of cells being programmed in parallel is read between each programming pulse to determine whether it is equal to or greater than a verify level to which it is being programmed. One means of verifying the programming is to test conduction at a specific compare point. The cells that are verified to be sufficiently programmed are locked out, for example in NAND cells, by pre-charging the bit line voltage from 0 to Vdd (e.g., 2.5 volts) to stop the programming process for those cells. In some cases, the number of pulses will be limited (e.g. 20 pulses) and if a given memory cell is not completely programmed by the last pulse, then an error is assumed. In some implementations, memory cells are erased (in blocks or other units) prior to programming.

One means for verifying is to apply a pulse at the word line corresponding to the target threshold value and determine whether the memory cell turns on. If so, the memory cell has reached its target threshold voltage value. For arrays of flash memory cells, many cells are verified in parallel. For some embodiments of multi-state flash memory cells, after every individual program pulse the memory cells will experience a set of verification steps to determine which state the memory cell is within. For example, a multi-state memory cell capable of storing data in eight states may need to perform verify operations for seven compare points. Thus, seven verify pulses are applied in order to perform seven verify operations between two consecutive programming pulses are. Based on the seven verify operations, the system can determine the state of the memory cells. Performing seven verify operations after each programming pulse slows down the programming process. One means for reducing the time burden of verifying is to use a more efficient verify process, for example, as disclosed in U.S. patent application Ser. No. 10/314,055, "Smart Verify for Multi-State Memories," filed Dec. 5, 2002, incorporated herein by reference in its entirety.

Looking at FIG. 5, a program voltage signal is depicted. This signal has a set of pulses with increasing magnitudes. Between the program pulses are verify pulses. The signal of FIG. 5 assumes a four state memory cell; therefore, it includes three verify pulses. For example, between programming pulses 280 and 282 are three verify pulses. The first verify pulse (or voltage level) 284 is depicted at zero volts. The second verify pulse 286 follows the first verify pulse (or voltage level). The third verify pulse 288 follows the second verify pulse 286.

In one embodiment of a two state memory cell according to the teachings of FIGS. 1-4A, the memory cell can have a higher threshold voltage when erased and a lower threshold voltage when programmed. For example, in one specific embodiment, the memory cell has a positive threshold voltage when erased and a negative threshold voltage when programmed. With regard to multi-state memory cells, in one embodiment, the highest threshold voltage distribution will represent the erased state and lower threshold voltage distributions will represent the programmed states.

Figure 6:
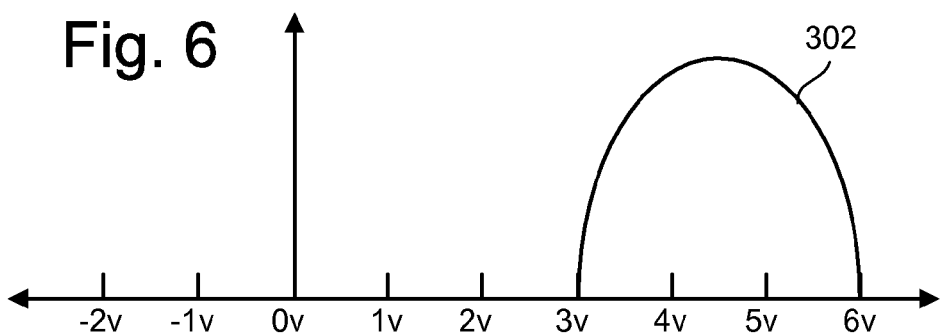
FIGS. 6-8 depict threshold voltage distributions for a non-volatile memory device according to one embodiment of the present invention.
Figure 7:
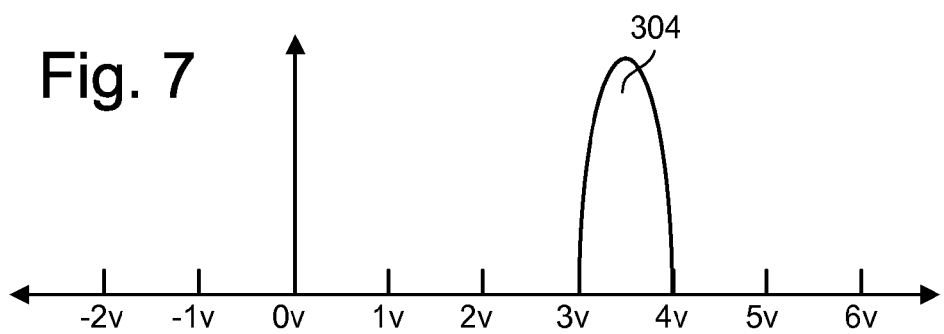
Figure 8:
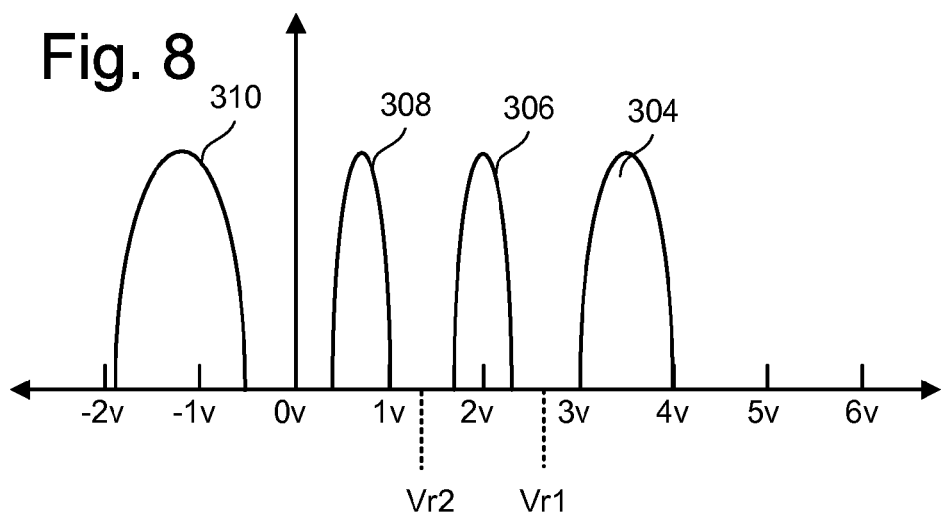

FIGS. 6-8 depict graphs of threshold voltage distributions. For example, FIG. 6 shows threshold voltage distribution 302 corresponding to the threshold voltages of a population of memory cells that have been erased. In some embodiments, threshold voltage distribution 302 is too wide for reliable operation; therefore, some or all of the erased memory cells will receive some programming in order to narrow the threshold distribution to be like threshold voltage distribution 304 of FIG. 7.

Compacting the wide erase distribution 302 into a narrower distribution 304 is referred to as soft programming. In standard NAND memories sufficient tightening of a wide erase distribution 302 by soft programming is achieved in a massively parallel operation where all the word lines in one erase block are simultaneously raised to a suitable soft programming starting voltage for a first soft programming pulse, and the soft programming pulses are stair cases in the same manner as regular programming. A single verify operation is performed after each soft programming pulse with all the word lines grounded, the roles of source and drain is reversed by applying VDD voltage to the source of NAND strings, and sensing the bit line voltage. As long as the bit line voltage rises above a first erase verify voltage (EV1) of for example, 1V, the soft programming operation will continue on that bit line. This rise of the bit line voltage indicates that the threshold voltage of none of the cells on the corresponding NAND string has risen to a high enough value of typically −0.8V to shut off the current in the string. During a soft programming verify operation, when an individual bit line voltage does no longer rise above EV1, that corresponding NAND string is locked out of subsequent soft programming pulses through the usual boosting techniques used for program inhibit. A final verify operation using grounded word lines, and a second sensing trip point EV2 of, for example 0.7V, is used to make sure no more than a tolerable number of strings contain one or more cells with threshold voltages above, for example −0.5V. Applying the same read voltage to all the word lines of a NAND string results in gaining the following information: 1) if the string is "ON" then all cells in the string have a threshold voltage below the voltage applied to all word lines, and 2) if the string is "OFF" then at least one cell has a threshold voltage greater than the applied word line voltage.

Since during soft programming verify operation the goal is finding the first cell on each string whose threshold voltage becomes smaller than a designated value, the massive multiple word line verify parallelism that is utilized in conventional NAND will no longer work for some embodiments of the present invention. One approach for soft programming can be the following. Apply, for example 4V, to every word line during verify operations, and lock out each string when it is detected to be "ON". Each string will be detected as being "ON" only when every cell in the string has been programmed to a threshold voltage below 4V. With this approach, the hope is that the distribution of threshold voltages within each group cells belonging to the same string is tight enough that when the threshold voltage of the slowest cell to program becomes less than 4V, the fastest to program cell will not have a threshold voltage that is less than 3V. This has to be the case for millions of strings. A final verify operation that has to proceed word line by word line is performed to make sure no more than an acceptable number of cells per each page has a threshold voltage below 3V. This last operation will not have the same parallelism as the conventional NAND. In the rare event that this approach fails, the block has to be erased again, and soft programming has to be performed one word line at a time, and in the same manner as regular programming. Another approach for increasing the soft programming speed is to use a coarser soft programming step size, which will result in a wider soft programmed distribution.

FIG. 8 shows four threshold distributions 304, 306, 308 and 310 corresponding to four states of multi-state memory cells. As described above, in one embodiment threshold voltage distribution 304 represents the erased state. Threshold voltage distributions 306, 308 and 310 represents the programmed states. The specific relationship between the data programmed into the memory cell and the threshold voltage ranges of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. Note that in one embodiment, threshold voltage distribution 310 is allowed to be wider than the other threshold voltage distributions because threshold voltage distribution 310 is the most heavily programmed state; therefore, there is less need for a tight distribution since the system will not be determining whether a memory cell is more heavily programmed than threshold voltage distribution 310. Because a wider distribution is used, the final state can be programmed with fewer pulses, maybe as few as one pulse.

The memory cells of FIGS. 1-4 are erased by transferring charge from the control gate to the floating gate. For example, electrons are transferred from the control gate to the floating gate via Fowler-Nordheim tunneling. In other embodiments, other mechanisms can be used. In one embodiment, erase is performed by applying 15 volts (or another suitable level) to the p-well, floating the source/drains and applying 0 volts to the control gate.

Figure 9:
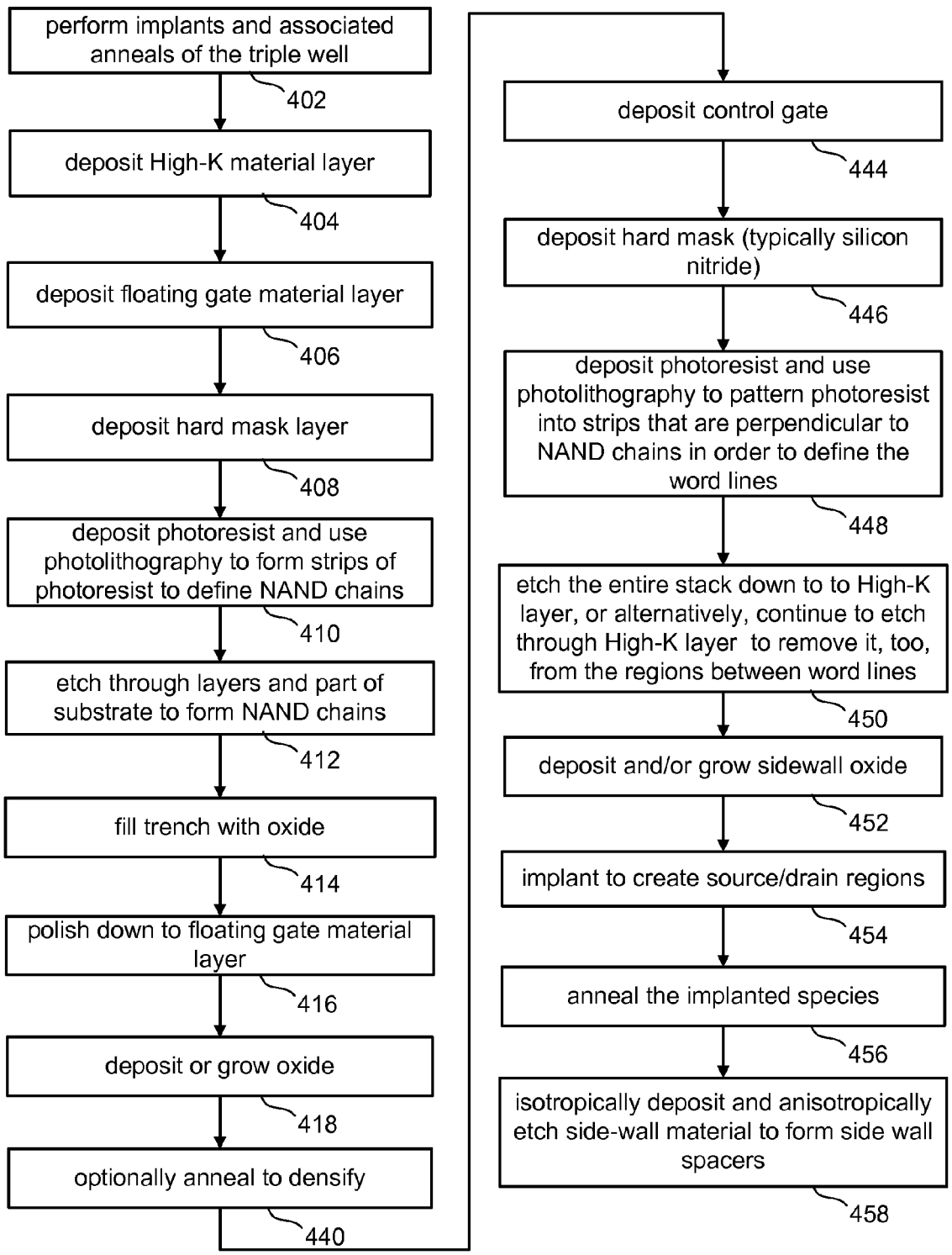
FIG. 9 is a flow chart describing one embodiment of the front end of a process for manufacturing the memory cell of FIG. 1.

FIG. 9 is a flow chart describing one embodiment of the front end of a process for manufacturing the memory cell of FIG. 1, which covers process steps only as far as forming the sidewall spacers. This flow does not cover the optional booster plates or fins, the gap fill of etched volumes between the stacks, or forming the contacts, metallizations, vias, and passivation. There are many ways to manufacture memory according to the present invention and, thus, the inventors contemplate that various methods other than that described by FIG. 9 can be used. While a flash memory chip will consist of both a peripheral circuitry, which includes a variety of low, medium, and high voltage transistors, and the core memory array, the process steps of FIG. 9 are intended only to describe in general terms one possible process recipe for the fabrication of the core memory array. Many photolithography, etch, implant, diffusion and oxidation steps that are intended for the fabrication of the peripheral transistors are omitted.

It should be noted that in flash memory chips, the convention has been to use the same floating gate oxide that is used between the floating gate and the channel for the gate oxide of low, and some medium voltage transistors in order to save extra process steps. Therefore the conventional tunnel oxide with a thickness that is usually greater than 8 nm has been limiting the performance, sub-threshold slope, and on-current drive of the low and some medium voltage transistors. This has resulted in slower program, and read characteristics. One advantage of the present invention is to provide a peripheral transistor gate oxide that is electrically and effectively much thinner than the conventional tunnel oxide, and is physically thicker than the conventional tunnel oxide. In other words, the peripheral circuitry will benefit from replacing the conventional tunnel oxide gate with high-K material(s) in alignment with the general trend of the semiconductor industry towards high-K materials.

Figure 10A:
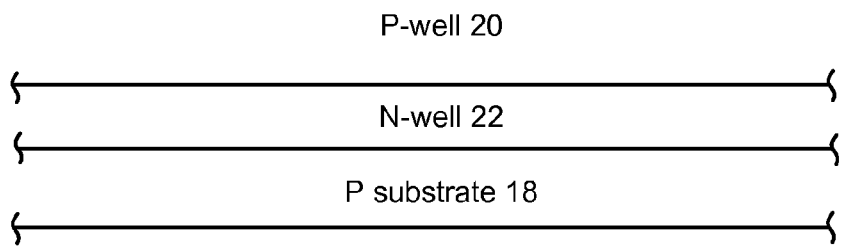
Figure 10B:
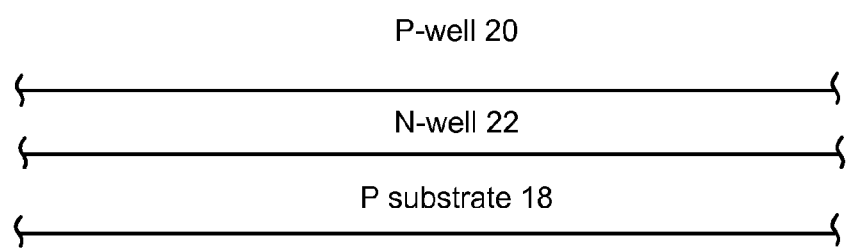

Step 402 of FIG. 9 includes performing implants and associated anneals of the triple well. The result of step 402 is depicted in FIG. 10A, which depicts P substrate 18, N-well 22 within P-substrate 18, and P-Well 20 within N-well 22. The sidewalls of the N-well that isolate the P-wells from one another are not depicted. Also the N-well depth is typically much thicker than that of the P-well in contrast to FIG. 10A. The P substrate is usually the thickest consisting of the majority of the wafer thickness. In step 404, the high-K material(s) is deposited on top of P-Well 20. The high-K material may be deposited using Chemical Vapor Deposition (CVD) including Metal Organic CVD (MOCVD), Physical Vapor Deposition (PVD), Atomic Layer Deposition (ALD), or another suitable method. Additionally (and optionally), other materials may be deposited on, deposited under or incorporated within the high-K material in order to form dielectric layer 30. The result of step 404 is depicted in FIG. 10B, which shows dielectric layer 30, with the high-K material. Note that one advantage of using the high-K material in the lower dielectric layer is that it can also be used for low voltage peripheral transistors to increase performance. In step 406, the floating gate is deposited over dielectric layer 30 using CVD, PVD, ALD or another suitable method. The result of step 402 is depicted in FIG. 10C, which shows floating gate layer 32 deposited on top of high-K dielectric layer 30.

Step 408 of FIG. 9 includes depositing a hard mask using, for example, CVD, to deposit $SiO_2$ or $Si_3N_4$. In step 410, photolithography is used to form strips of photoresist over what will become the NAND chains. Step 412 includes etching through all layers, including part of the substrate. First, the hard mask is etched through using anisotropic plasma etching, (i.e. reactive ion etching with the proper balance between physical and chemical etching for each planar layer encountered). After the hard mask layer is etched into strips, the photoresist can be stripped away and the hard mask layer can be used as the mask for etching the underlying layers. The process, then includes etching through the floating gate material, the high-K dielectric material and approximately 0.1 micron into the substrate to create trenches between the NAND strings, where the bottom of the trenches are inside the top P-well 20. In step 414, the trenches are filled with $SiO_2$ (or another suitable material) up to the top of the hard mask using CVD, rapid ALD or PSZ STI fill as described in "Void Free and Low Stress Shallow Trench Isolation Technology using P-SOG for sub 0.1 Device" by Jin-Hwa Heo, et. al. in 2002 Symposium on VLSI Technology Digest of Technical Papers, Session 14-1. PSZ STI fill is Polysilazane Shallow trench isolation fill The fill sequence includes spin coat by coater, and density by furnace. Si—N bond conversion to Si—O bond enables less shrinkage than conventional SOG (Spin On Glass). Steam oxidation is effective for efficient conversion. One proposal is to use Spin-On-Glass (SOG) for the dielectric layer, which is called polysilazane-based SOG (SZ-SOG), a material used in integrating the inter layer dielectric (ILD) applications because of its excellent gap filling and planarization properties, and thermal oxide like film qualities.

In step 416 Chemical Mechanical Polishing (CMP), or another suitable process, is used to polish the material flat until reaching the floating gate poly-silicon. The floating gate is polished to 20 nm (10-100 nm in other embodiments). In step 418, the inter-poly tunnel dielectric (e.g. dielectric 34) is grown or deposited using ALD, CVD, PVD, Jet Vapor Deposition (JVD) or another suitable process. FIG. 10D, which shows the inter-poly dielectric region 34 over floating gate 32, depicts the device after step 418. Examples of materials that can be used for the inter-poly tunnel dielectric include (but are not limited to) $SiO_2$, $Si_3N_4$, an alloy with a varying mole fraction as a function of depth, an alloy or nano-laminate of aluminum oxide and silicon oxide, an alloy or nano-laminate of silicon nitride and silicon oxide, an alloy or nano-laminate of silicon oxide and hafnium oxide, an alloy or nano-laminate of aluminum oxide and hafnium oxide, or other suitable materials.

In one embodiment, the inter-poly tunnel oxide layer can be created in the manner disclosed by "Resonant Fowler-Nordheim Tunneling through Layered Tunnel Barriers and its Possible Applications," Alexander Korotkov and Konstantin Likharev, 1999 IEEE, 0-7803-5413-3/99 (hereinafter "Likharev I"); "Riding the Crest of a New Wave in Memory, NOVORAM: A new Concept for Fast, Bit-Addressable Non-volatile Memory Based on Crested Barriers," Konstantin and Likharev, Circuits and Devices, July 2000, p. 17 (hereinafter "Likharev II"); or U.S. Pat. No. 6,121,654 granted Sep. 19, 2000 titled: "Memory device having a crested tunnel barrier" all of which are incorporated herein by reference in their entirety. The oxide layer bottom of the conduction band energy diagram can be rounded near the mid-depth region of the tunnel dielectric, instead of forming a sharp triangle as in FIG. 3a of U.S. Pat. No. 6,121,654, which is incorporated herein by reference in its entirety, by varying the mole fraction of binary oxides such as $(HfO_2)_x(Al_2O_3)_{1-x}$ Atomic layer deposition (ALD) can be employed to deposit mixed multiple dielectrics (e.g. $(HfO_2)_x(Al_2O_3)_{1-x}$) (see "Energy gap and band alignment for —$(HfO_2)_x(Al_2O_3)_{1-x}$ on —100-Si" by H. Y. Yu et. al. Applied Physics Letters Volume 81, Number 28, July 2002 ("hereinafter "Yu")), whose mole fraction, x, gradually changes with depth into the oxide in order to create crested barriers (see Likharev I and Likharev II) that not only facilitate tunneling at lower voltages but also improve retention time and reduce disturb problems. Also Hafnium oxide and Silicon oxide, or Aluminum oxide and Silicon oxide can be paired to create crested conduction band edges. There are probably many more ALD deposited material systems composed of 2 or more materials that can have their conduction band edge energy level change in a linear or non-linear manner with changing depth in order to optimize the conduction band engineering of the tunnel dielectric. Switching of chemistry of ALD deposited tunnel barriers after every single cycle or after every few cycles of deposition can create the gradual change of mole fraction that may be conducive to constructing a tunnel dielectric that does not suffer from the issues arising from having material interfaces within the tunnel dielectric, such as trapping at mentioned interfaces. An anneal of proper duration and temperature may further smooth the changing of mole fraction. For a crested barrier, the mole fraction x has to smaller near the interfaces and gradually peak at the middle of the barrier).

Figure 10E:
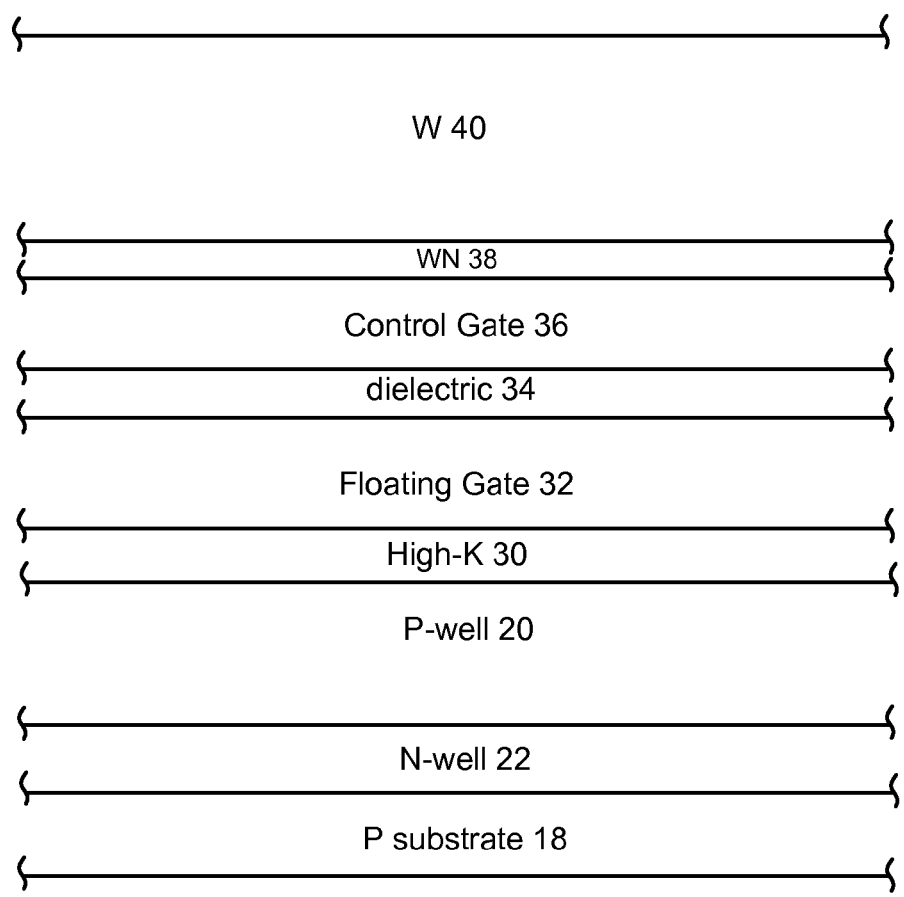

In step 440 of FIG. 9, which is an optional step, the inter-poly tunnel oxide is annealed to density the oxide, without damaging the high-K materials due to a high temperature. Note that $Al_2O_3$ will crystallize at approximately 800 degrees Celsius, $HfO_2$ will crystallize at approximately 500 degrees Celsius, $HfSiO_x$ will crystallize at approximately 1100 degrees Celsius, and HfSiON will crystallize at approximately 1300 degrees Celsius. In general, longer exposure times to high temperatures will result in reduced crystallization temperatures. Some of the most reliable tunnel oxides are grown Silicon Oxi-Nitride, grown Silicon Oxide, and low temperature grown oxide by Oxygen Radical generation in high density Krypton plasma at temperatures as low as 400 degrees Celsius. In step 444, the one or more layers of the control gate are deposited on the inter-poly tunnel oxide. In one embodiment, the materials deposited during step 444 include poly-silicon (e.g. layer 36), while in other embodiments this layer may be a metal layer with a proper work function, thermal stability, and etch characteristics. In some embodiments, the control gate is composed of the poly-silicon layer 36, tungsten-nitride layer 38, and tungsten layer 40, all of which are deposited in step 444. Nitride layer 38 and tungsten layer 40 are deposited to reduce the control gate sheet resistance and form lower resistivity word lines. These materials can be deposited in a blanket form using CVD, ALD, PVD or other suitable process. FIG. 10E, which shows poly-silicon control gate 36, WN layer 38 and Tungsten metal layer 40 over inter-poly tunnel oxide 34, depicts the device after step 444.

On top of the Tungsten layer, a hard mask of $Si_3N_4$ is deposited using, for example, CVD in step 446. In step 448, photolithography is used to create patterns of perpendicular strips to the NAND chain, in order to etch the multi-gate stack and form word lines (i.e. control gates) that are isolated from one another. In step 450, etching is performed using plasma etching, ion milling, ion etching that is purely physical etching, or another suitable process to etch the various layers and form the individual word lines. In one embodiment, the etching is performed until the high-k material is reached. The process attempts to leave as much high-K material as possible, but tries to etch completely through the floating gate material. In another embodiment, the process will etch all the way to the substrate. FIG. 10F, which shows the stack, depicts the device after step 450. Note that the size of the p-well, n-well and P substrate are not necessarily drawn to scale.

In step 452, sidewall oxidation, sidewall oxide deposition, or a combination of the two is performed. For side wall oxidation, the device is placed in a furnace at a high temperature and some fractional percentage of ambient oxygen gas, so that the exposed surfaces oxidize, which provides a protection layer. Sidewall oxidation can also be used to round the edges of the floating gate and the control gate. An alternative to high temperature (e.g. over 1000 degrees Celsius) oxide growth is low temperature (e.g. 400 degrees Celsius) oxide growth in high density Krypton plasma. More information about sidewall oxidation can be found in "New Paradigm of Silicon Technology," Ohmi, Kotani, Hirayama and Morimoto, Proceedings of the IEEE, Vol. 89, No. 3, March 2001; "Low-Tempetrature Growth of High Silicon Oxide Films by Oxygen Radical Generated in High Density Krypton Plasma," Hirayama, Sekine, Saito and Ohmi, Dept. of Electronic Engineering, Tohoku University, Japan, 1999 IEEE; and "Highly Reliable Ultrathin Silicon Oxide Film Formation at Low Temperature by Oxygen Radical Generated in High-Density Krypton Plasma," Sekine, Saito, Hirayama and Ohmi, Tohoku University, Japan, 2001 IEEE; all three of which are incorporated herein by reference in their entirety. Another way to deposit low temperature tunnel oxide may be by using Krypton Plasma, in conjunction with atomic layer deposition of Silicon Oxide or silicon Oxi-Nitride.

To achieve uniform tunneling a processing step may be employed in order to make the inter-gate tunnel dielectric thicker at the edges where the field lines may be more concentrated than near the middle. Oxidation may be a suitable way of achieving this end.

In step 454, an implant process is performed to create the N+ source/drain regions by Arsenic implantation. In one embodiment, a halo implant is also used. In step 456, an anneal process is performed. In one embodiment, a low temperature anneal process is performed to prevent damage to the high-K material. In some embodiments, a high-K material can be used that has a high thermal budget (e.g., able to endure high temperatures without degrading). In step 458, the process includes isotropically depositing and aniotropically etching sidewall material to form sidewall spacers.

There are many alternatives to the above described structures and processes within the spirit of the present invention. Textured gate (asperities) inter-gate tunneling is also possible, as well as Silicon-rich oxides, and graded band dielectrics. As in the existing NAND embodiment, an alternative is to fabricate the memory cells from PMOS devices with opposite polarity bias conditions for the various operations as compared to the existing NMOS implementation.

The low control gate coupling ratio will reduce the amount of floating gate charge needed to cause one volt of threshold shift as measured from the control gate as compared to existing NAND devices with its relatively high control gate coupling ratio. The benefit of this is lower programming/erase voltage levels, as compared to existing NAND. Alternatively, this advantage can be used to increase dielectric thicknesses, maintaining same program/erase voltages as in use today, but increasing overall cell reliability. Negative consequences of this are that effects of cell noise and electron charge gain or loss become amplified by the inverse of the control gate coupling ratio. These become manifest as larger shifts in threshold voltage for smaller values of control gate coupling ratio. In this respect, it is desirable not to have too small a control gate coupling ratio. A very small control gate coupling ratio will also limit the range of the amount of readable excess charge on the floating gate.

One embodiment would have a high temperature tolerant channel dielectric, such as Hafnium Silicate or Aluminum Oxide. A relatively thin poly-silicon floating gate, a suitable inter-gate dielectric, and a word line consisting of poly-silicon, covered by Tungsten Nitride, followed by Tungsten, constitute an embodiment that does not have to resort to a Damascene process. However, if poly-crystallization of amorphous-as-deposited silicon floating gate is to be avoided, then a low thermal budget process may have to be adopted that may include the Damascene process. An amorphous floating gate may offer a better quality tunneling oxide grown or deposited there upon.

Silicon Nitride has been proposed as a tunneling material for flash memories. A Damascene process can be employed to implant and anneal the source/drain junction of the memory array before the stack gates or some layers of the stack are deposited. Some materials such as Hafnium Oxide tend to crystallize at moderately high processing temperatures, which can lead to leakage currents at grain boundaries. To avoid crystallization a Damascene process avoiding such high temperature exposure post high-K dielectric deposition can be adopted.

Figure 11:
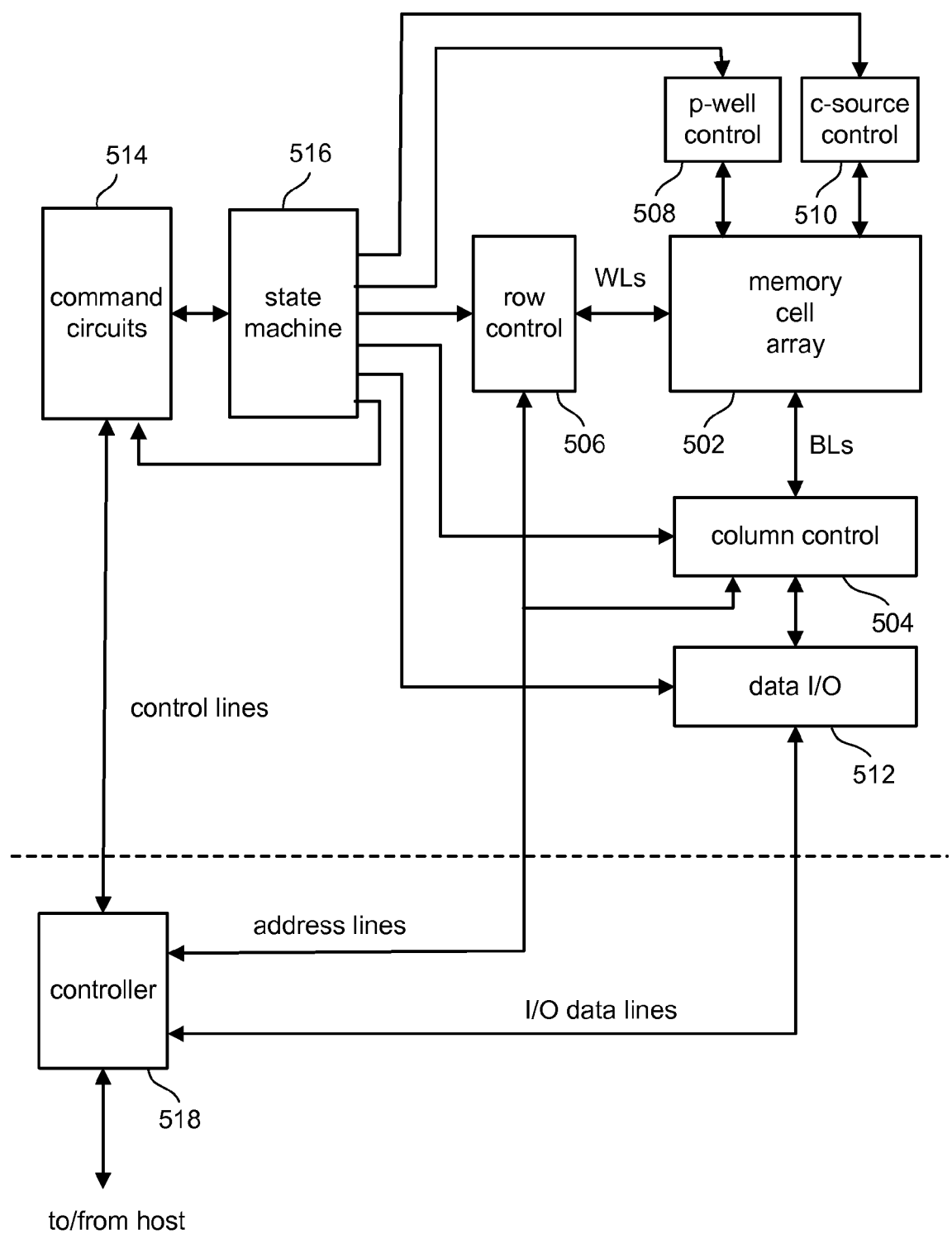
FIG. 11 is a block diagram of one example of a memory system that can be used to implement the present invention.

FIG. 11 is a block diagram of one embodiment of a flash memory system that can be used to implement the present invention. Memory cell array 502 is controlled by column control circuit 504, row control circuit 506, c-source control circuit 510 and p-well control circuit 508. Column control circuit 504 is connected to the bit lines of memory cell array 502 for reading data stored in the memory cells, for determining a state of the memory cells during a program operation, and for controlling potential levels of the bit lines to promote the programming or to inhibit the programming. Row control circuit 506 is connected to the word lines to select one of the word lines, to apply read voltages, to apply program voltages and to apply an erase voltage. C-source control circuit 510 controls a common source line (labeled as "C-source" in FIG. 12) connected to the memory cells. P-well control circuit 508 controls the p-well voltage during erase operations to, for example, apply positive voltages to the P-well while the word lines of a block that is selected for an erase operation are grounded.

The data stored in the memory cells are read out by the column control circuit 504 and are output to external I/O lines via data input/output buffer 512. Program data to be stored in the memory cells are input to the data input/output buffer 512 via the external I/O lines, and transferred to the column control circuit 504. The external I/O lines are connected to controller 518.

Command data for controlling the flash memory device is input to controller 518. The command data informs the flash memory of what operation is requested. The input command is transferred to state machine 516, which controls column control circuit 504, row control circuit 506, c-source control 510, p-well control circuit 508 and data input/output buffer 512. State machine 516 can also output status data of the flash memory such as READY/BUSY or PASS/FAIL.

Controller 518 is connected or connectable with a host system such as a personal computer, a digital camera, personal digital assistant, etc. Controller 518 communicates with the host in order to receive commands from the host, receive data from the host, provide data to the host and provide status information to the host. Controller 518 converts commands from the host into command signals that can be interpreted and executed by command circuits 514, which is in communication with state machine 516. Controller 518 typically contains buffer memory for the user data being written to or read from the memory array.

One exemplar memory system comprises one integrated circuit that includes controller 518, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory chip(s) and associated peripheral circuits (with the Controller being embedded in the host). Thus, the controller can be embedded in the host or included within a removable memory system.

In some implementations, some of the components of FIG. 11 can be combined. In various designs, all or some of the components of FIG. 11, other than memory cell array 502, can be thought of as control circuits or a control circuit.

In one embodiment of the present invention, NAND type flash memory cells are used. The NAND cells are arranged with multiple transistors in series between two select gates. The transistors in series and the select gates are referred to as a NAND string. The discussion herein is not limited to any particular number of memory cells in a NAND string or NAND chain. Furthermore, the present invention is not limited to NAND flash memory cells. In other embodiments flash memory cells other than NAND cells (e.g. NOR cells or other cells) can be used to implement the present invention. In yet other embodiments, non-volatile memory cells other than flash memory cells can be used to implement the present invention.

Relevant examples of NAND type flash memories and their operation are provided in the following U.S. patents/patent applications, all of which are incorporated herein by reference in their entirety: U.S. Pat. Nos. 5,570,315; 5,774,397; 6,046,935; 5,386,422; 6,456,528 and U.S. patent application. Ser. No. 09/893,277 (Publication No. US2003/0002348). Information about programming NAND flash memory, including self boosting techniques, can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety. Other types of flash memory devices can also be used with the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

Figure 12:
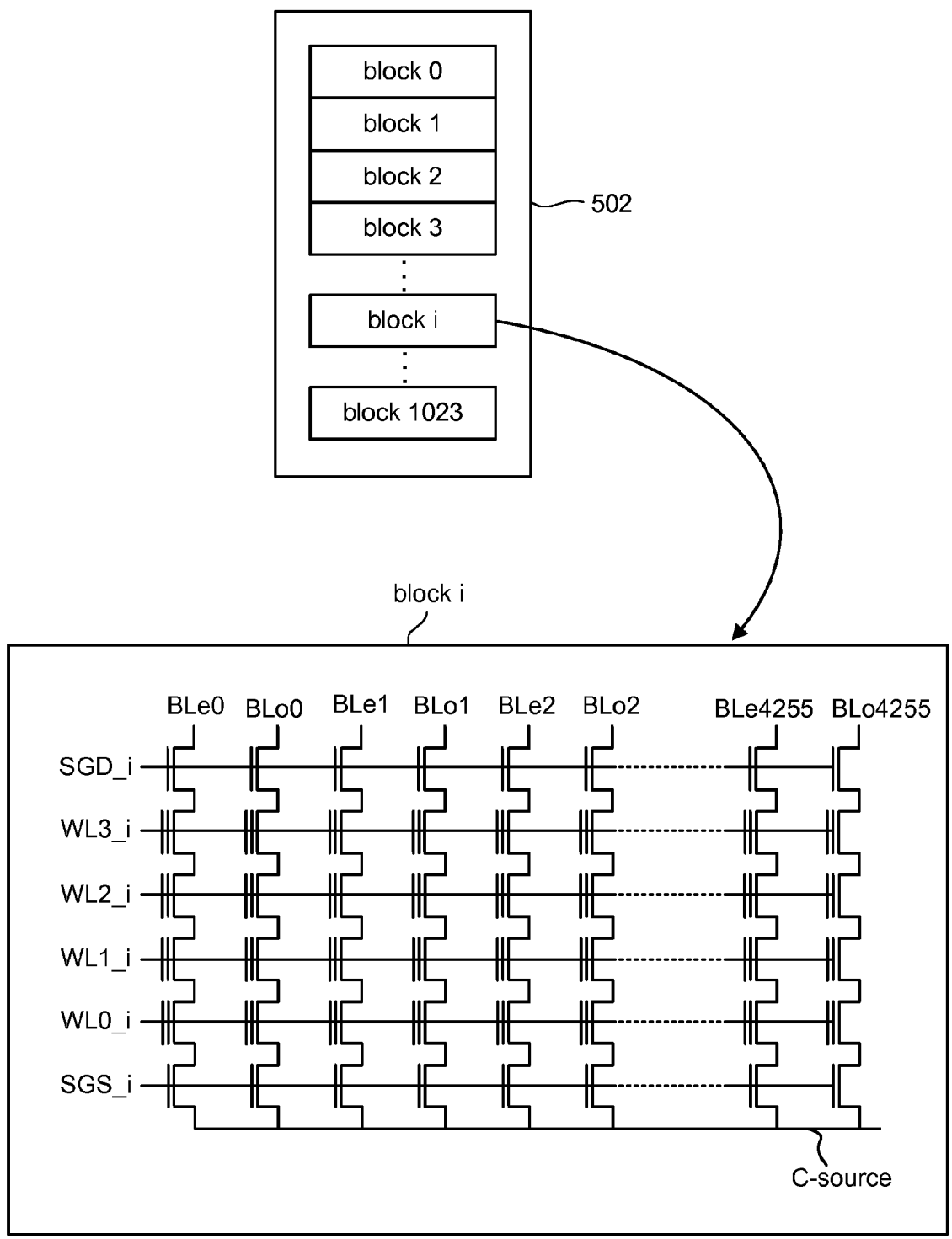
FIG. 12 illustrates an example of an organization of a memory array.

FIG. 12 depicts an example of an organization of memory cell array 502, using NAND memory cells. Memory cell array 502 is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo).

FIG. 12 shows four memory cells connected in series to form a NAND string. Although four cells are shown to be included in each NAND string, more or less than four memory cells can be used. One terminal of the NAND string is connected to corresponding bit line via a first select transistor SGD, and another terminal is connected to c-source via a second select transistor SGS.

During read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. In one embodiment, these 532 bytes of data that are simultaneously read or programmed form a logical page. Therefore, one block can store at least eight logical pages (four word lines, each with odd and even pages). When each memory cell stores two bits of data (e.g. a multi-level cell), one block stores 16 logical pages. Other sized blocks and pages can also be used with the present invention. Additionally, architectures other than that of FIGS. 11 and 12 can also be used to implement the present invention.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0V. In a verify operation for a two level memory cell, the selected word line WL2 is connected to 2.4V, for example, so that it is verified whether the threshold voltage has reached at least 2.4V. For a multi-state memory cell, a read operation to distinguish between whether the memory cell is in a state corresponding to threshold distribution 306 or a state corresponding to threshold distribution 308 may include placing a voltage on the word line corresponding to a compare point between threshold distribution 306 and threshold distribution 308 (e.g., the mid point between threshold distribution 306 and threshold distribution 308). The source and p-well are at zero volts. The selected bit lines (BLe) are pre-charged to a level of, for example, 0.7V. If the threshold voltage is higher than the read or verify level on the word line, the potential level of the concerned bit line (BLe) maintains the high level because of the non-conductive memory cell. On the other hand, if the threshold voltage is lower than the read or verify level, the potential level of the concerned bit line (BLe) decreases to a low level by the end of sensing integration time, for example less than 0.3V, because of the conductive memory cell. The state of the memory cell is, thereby, detected by a sense amplifier that is connected to the bit line.

The erase, read and verify operations described above are performed according to techniques known in the art. Thus, many of the details explained can be varied by one skilled in the art. Other read and verify techniques known in the art can also be used.

Figure 13:
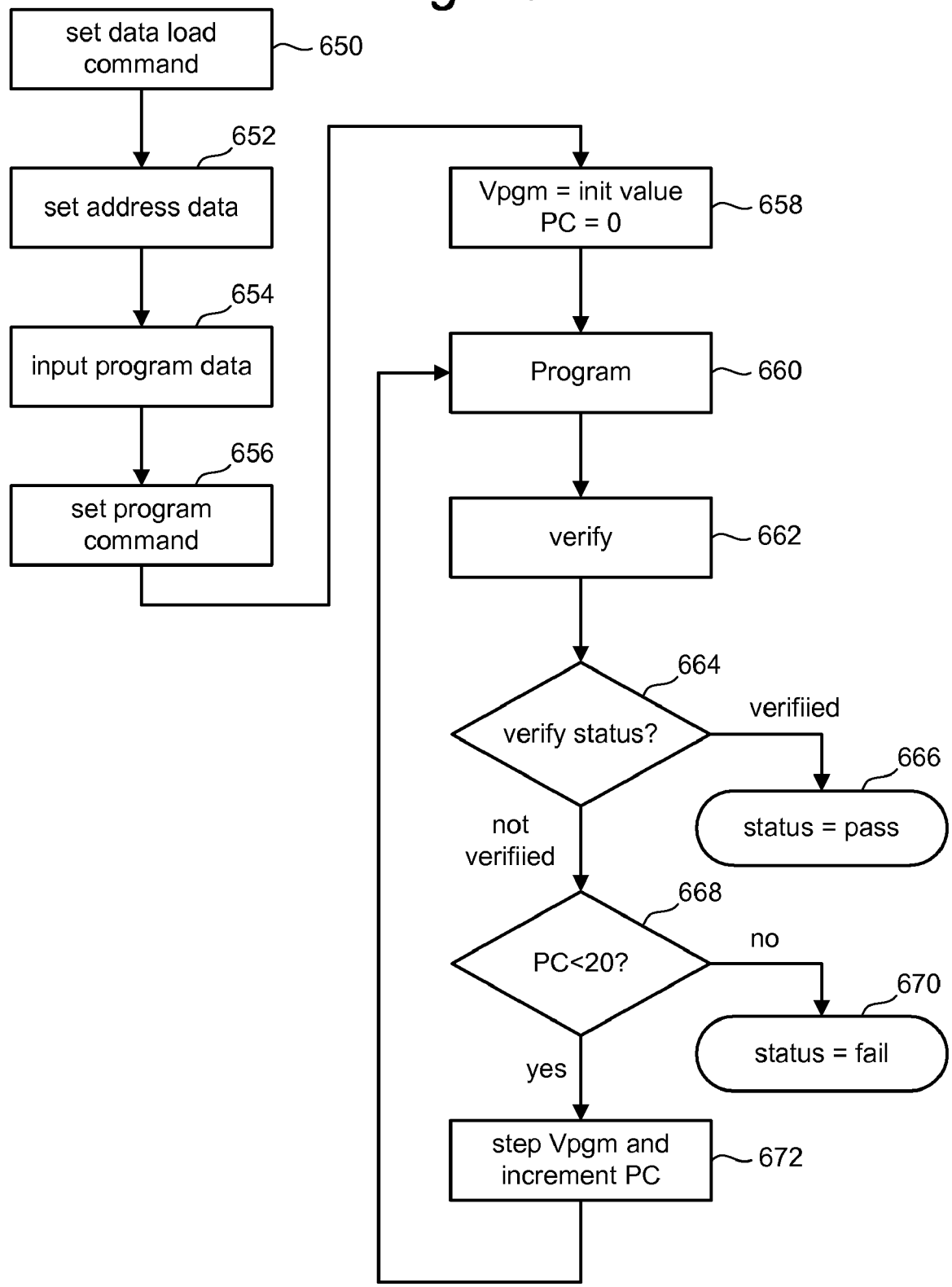
FIG. 13 is a flow chart describing one embodiment of a process for programming non-volatile memory devices.

FIG. 13 is a flow chart describing one embodiment for programming one or more memory cells of array 502. In step 650 of FIG. 13, the operation starts by receiving a data load command from the host and placing that data load command in the state machine. In step 652, address data is received from the host and stored in the state machine in order to select the page to be used for the write operation. In step 654, the data to be written is received and stored. In step 656, a program command is received from the host and that program command is stored in the state machine. In one embodiment, after the program command is stored in the state machine, the operation of the subsequent steps are automatically started by the state machine. In step 658, the initial value of the program voltage Vpgm is set (e.g., 7-12 volts; however, other values can also be used). Additionally, the program counter (PC) is initialized to 0. In step 660, the next program pulse is applied to the control gate (word line) of the memory cell. In step 662, the memory cell is verified to determine if its threshold voltage has reached the target level. If, in step 664, the verification process passes (because the threshold voltage has reached the target), then the programming process has completed successfully for that memory cell (step 666). If the verification process did not pass (step 664), then it is determined whether the program counter is less than twenty (step 668). If the program counter is not less than twenty, then the programming process has failed (step 670). If the program counter is less than twenty, then in step 672 the program voltage is increased by the step size (e.g. 0.2 volts, 0.4 volts, or another suitable value) and the program counter is incremented. After step 672, the process loops back to step 660.

Figure 14:
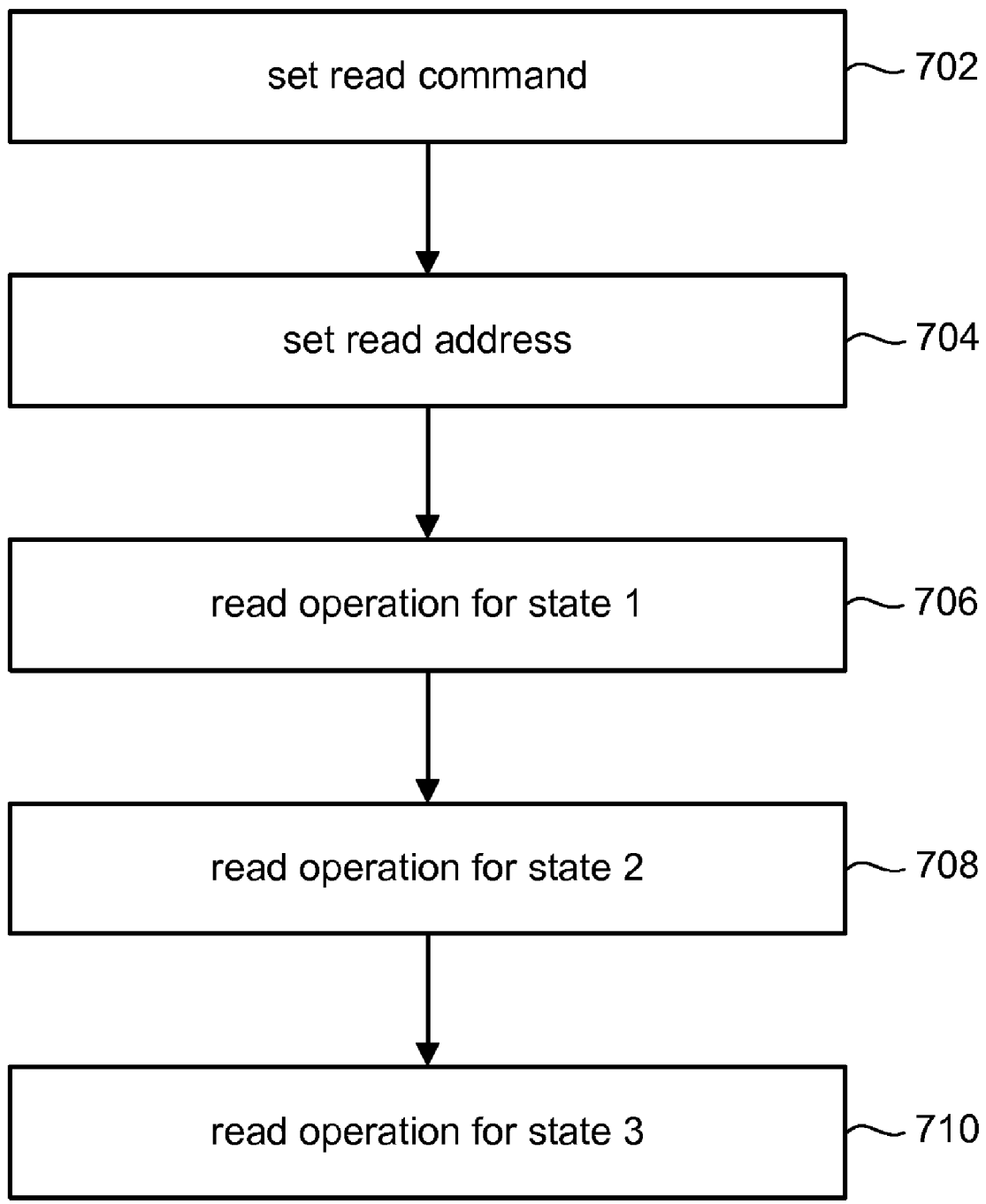
FIG. 14 is a flow chart describing one embodiment of a process for reading non-volatile memory devices.

FIG. 14 is a flow chart describing one embodiment of a process for reading a memory cell in array 502. In step 702, a read command is received from the host and stored in the state machine. In step 704, an address is received and stored. The process of FIG. 14 assumes a four state memory cell, with an erased state and three programmed states. Therefore, in one embodiment, three read operations are performed in order to read the data stored in the memory cell. If the memory has eight states, then seven read operations are performed; if the memory has sixteen states, then fifteen read operations are performed, etc. In step 706, the first read operation is performed. A first read compare point (e.g. Vr1), equivalent to a threshold voltage between state 0 (e.g. threshold voltage distribution 304 of FIG. 8) and state 1 (e.g. threshold voltage distribution 306 of FIG. 8) is applied to the selected word line, and the sense amplifier on each bit line makes a binary decision as to whether the cell at the intersection of the selected word line and the corresponding bit line is on or off. If the cell is detected to be on, then it is read as being in state 0, otherwise the cell is in state 1, 2 or 3. In other words, if the threshold voltage of the memory cell is greater than the first read compare point, the memory cell is assumed to be in the erased state 0.

In step 708, the second read operation is performed. A second read compare point (e.g. Vr2), equivalent to a threshold voltage between state 2 (e.g. threshold voltage distribution 308 of FIG. 8) and state 1 is applied to the selected word line, and the sense amplifier on each bit line makes a binary decision as to whether the cell at the intersection of the selected word line and the corresponding bit line is on or off. An "off" bit line indicate that the corresponding memory cell is either in state 0 or in state 1. An "on" bit line indicates that the corresponding memory cell is in either state 2 or state 3 (e.g. threshold voltage distribution 310 of FIG. 8).

In step 710, the third read operation is performed. A third read compare point (e.g. 0V), equivalent to a threshold voltage between state 3 and state 2 is applied to the selected word line, and the sense amplifier on each bit line makes a binary decision as to whether the cell at the intersection of the selected word line and the corresponding bit line is on or off. An "off" bit line will indicate that the corresponding cell is either in state 0, in state 1, or in state 2. An "on" bit line will indicate that the corresponding memory cell is in state 3. The information obtained during the three sequential steps explained above is stored in latches. A decoder is used to combine the results of the three read operations in order to find the state of each cell. For example, state 1 would be a result of the following three read results: on in step 706, off in step 708, and off in step 710. The above sequence of the read operations can be reversed, corresponding to the verify waveform sequence depicted in FIG. 5. Note that other read processes can also be used with the present invention.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A non-volatile storage device, comprising:
   source/drain regions;
   a channel region between said source/drain regions;
   a floating gate;
   a control gate;
   a first dielectric region between said channel region and said floating gate, said first dielectric region includes a high-K material; and
   a second dielectric region between said floating gate and said control gate, wherein charge is tunneled in both directions between said floating gate and said control gate via said second dielectric region while said control gate receives a non-negative voltage;
   said source/drain regions, said channel region, said floating gate, said control gate, said first dielectric region and said second dielectric region form a NAND device.

2. A non-volatile storage device according to claim 1, wherein:
   said charge is tunneled in both directions between said floating gate and said control gate via said second dielectric region using Fowler-Nordheim tunneling.

3. A non-volatile storage device according to claim 1, wherein:
   during an erase operation, electrons are tunneled from said control gate to said floating gate while said control gate receives 0 volts; and
   during a programming operation, electrons are tunneled from said floating gate to said control gate while said control gate receives a large positive voltage.

4. A non-volatile storage device according to claim 1, wherein:
   electrons are tunneled in both directions between said floating gate and said control gate via said second dielectric region using Fowler-Nordheim tunneling.

5. A non-volatile storage device according to claim 1, wherein:
   said non-volatile storage device is a multi-state flash memory device.

6. A non-volatile storage device according to claim 1, wherein:
   said source/drains regions are N+ diffusion regions in a p-well; and said channel regions is in said p-well.

7. A non-volatile storage device according to claim 1, wherein:
   said floating gate, said control gate, said first dielectric and said second dielectric are a stack; and
   said non-volatile storage device further includes a first spacer at one side of said stack and a second spacer at a second side of said stack.

8. A non-volatile storage device according to claim 7, further comprising:
   a first epitaxially grown silicon region adjacent said first spacer; and
   a second epitaxially grown silicon region adjacent said second spacer.

9. A non-volatile storage device according to claim 1, wherein:
   said control gate comprises a poly-silicon layer, a tungsten nitride barrier layer and a tungsten metal layer.

10. A non-volatile storage device according to claim 1, wherein:
    during an erase operation, electrons are transferred from said control gate to said floating gate; and
    during a programming operation, electrons are transferred from said floating gate to said control gate.

11. A non-volatile storage device, comprising: a NAND flash memory device comprising:
    N+ diffusion source/drain regions formed in a p-well,
    a channel region in said p-well between said N+ diffusion source/drain regions,
    a floating gate,
    a control gate,
    a first dielectric region between said channel region and said floating gate, said first dielectric region includes a high-K material, and
    a second dielectric region between said floating gate and said control gate, said non-volatile storage device changes its programming condition by transferring a same type of charge in opposite directions between said floating gate and said control gate via said second dielectric region while a non-negative voltage is applied to said control gate.

12. A non-volatile storage device according to claim 11, wherein:
    said NAND flash memory device is a multi-state flash memory device.

13. A non-volatile storage device according to claim 11, wherein:
    said floating gate, said control gate, said first dielectric and said second dielectric are a stack; and
    said non-volatile storage device further includes a first spacer at one side of said stack and a second spacer at a second side of said stack.

14. A non-volatile storage device according to claim 11, wherein:
    said control circuit also causes charge to tunnel from said floating gate to said control gate.

15. a non-volatile storage device according to claim 11, wherein:
    during an erase operation, said control circuit causes electrons to be transferred from said control gate to said floating gate; and
    during a programming operation, said control circuit causes electrons to be transferred from said floatint gate to said control gate.

16. A non-volatile storage device, comprising:
    N+ diffusion source/drain regions formed in a p-well;
    a channel region in said p-well between said N + diffusion source/drain regions;
    a floating gate;
    a control gate;

a first dielectric region between said channel region and said floating gate, said first dielectric region includes a high-K material;

a second dielectric region between said floating gate and said control gate, said non-volatile storage device changes its programming condition by transferring a same type of charge in opposite directions between said floating gate and said control gate via said second dielectric region while a non-negative voltage is applied to said control gate;

said N+ diffusion source/drain regions, said channel region, said floating gate, said control gate, said first dielectric region and said second dielectric region form a NAND flash memory device.

17. A non-volatile storage device according to claim 16, wherein:
said programming condition includes an erased state or any of three programmed states.

18. A non-volatile storage device according to claim 16, wherein:
said non-volatile storage device changes its programming condition by transferring electrons from said control gate to said floating gate via said second dielectric region while said control gate is biased by a non-negative voltage.

19. A non-volatile storage device according to claim 16, wherein:
said transferring a same type of charge includes tunneling electrons.

20. A non-volatile storage device according to claim 16, wherein:
said floating gate, said control gate, said first dielectric and said second dielectric are a stack; and
said non-volatile storage device further includes a first spacer at one side of said stack and a second spacer at a second side of said stack.

21. A non-volatile storage device according to claim 20, further comprising:
an oxide region surrounding said stack.

22. A non-volatile storage device according to claim 20, further comprising:
a first epitaxially grown silicon region adjacent said first spacer; and
a second epitaxially grown silicon region adjacent said second spacer.

23. A non-volatile storage device according to claim 16, wherein:
said control gate comprises a poly-silicon layer, a tungsten nitride barrier layer and a tungsten metal layer.

24. A non-volatile storage device according to claim 16, wherein:
said floating gate has rounded edges.

25. A non-volatile storage device according to claim 1, wherein:
said non-volatile storage device is a multi-state flash memory device.

26. A non-volatile storage device, comprising: a NAND device comprising:
a p-well;
N+ diffusion source/drain regions formed in said p-well,
a channel region in said p-well between said N + diffusion source/drain regions,
a floating gate,
a control gate,
a first dielectric region between said channel region and said floating gate, said first dielectric region includes a high-K material, and a second dielectric region between said floating gate and said control gate; and
a control circuit, said control circuit changes said NAND device's programming condition by transferring a same type of charge in opposite directions between said floating gate and said control gate via said second dielectric region while said control circuit causes a non-negative voltage to be applied to said control gate.

27. A non-volatile storage device according to claim 26, wherein:
said floating gate, said control gate, said first dielectric and said second dielectric are a stack; and
said non-volatile storage device further includes a first spacer at one side of said stack and a second spacer at a second side of said stack.

28. A non-volatile storage device according to claim 26, wherein:
said transferring a same type of charge includes transferring electrons.

29. A non-volatile storage device according to claim 26, wherein:
said transferring a same type of charge includes tunneling electrons.

30. A non-volatile storage device according to claim 26, wherein:
said NAND device is a multi-state flash memory device.

31. A non-volatile storage device according to claim 26, wherein:
said control circuit comprises command circuits, a state machine, a row control circuit, a column control circuit, a p-well control circuit and a source control circuit.

32. A non-volatile storage device according to claim 26, wherein:
said transferring a same type of charge in opposite directions between said floating gate and said control gate via said second dielectric region includes transferring said charge in a first direction during programming and transferring said charge in a second direction during erasing.

33. A non-volatile storage device according to claim 26, wherein:
said transferring a same type of charge in opposite directions between said floating gate and said control gate via said second dielectric region includes transferring electrons from said floating gate to said control gate during programming and transferring said electrons from said control gate to said floating gate during erasing.

34. A method for operating non-volatile storage, comprising:
applying a voltage to a substrate for a NAND flash memory element, said voltage is greater than zero volts, said substrate being separated from a floating gate of said NAND flash memory element by a first dielectric region of said NAND flash memory element that includes a high-K material;
applying a non-negative voltage to a control gate of said NAND flash memory element; and
tunneling electrons from said control gate to said floating gate across a second dielectric region of said NAND flash memory element while applying said non-negative voltage to said control gate, said second dielectric region is positioned between said control gate and said floating gate.

35. A method according to claim 34, wherein:
said tunneling electrons from said control gate to said floating gate is performed as part of an erase process.

36. A method for operating non-volatile storage, comprising:

applying a non-negative voltage to a control gate of a NAND flash memory element;

transferring a first type of charge from said control gate to a floating gate of said NAND flash memory element while applying said non-negative voltage to said control gate; and transferring said first type of charge from said floating gate to said control.

37. A method according to claim 36, wherein:
said first type of charge is electrons.

38. A method according to claim 36, wherein:
transferring said first type of charge from said control gate to said floating gate is part of an erase process.

39. A method according to claim 38, wherein:
transferring said first type of charge from said floating gate to said control gate is part of a programming process.

40. A non-volatile storage device, comprising:
N+ diffusion source/drain regions;
a channel region between said N + diffusion source/drain regions;
a floating gate;
a control gate;
a first dielectric region between said channel region and said floating gate, said first dielectric region includes a high-K material; and
a second dielectric region between said floating gate and said control gate, electrons are transferred from said control gate to said floating gate via said second dielectric region while said control gate receives a non-negative voltage:
said N+ diffusion source/drain regions, said channel region, said floating gate, said control gate, said first dielectric region and said second dielectric region form a NAND device.

41. A non-volatile storage device according to claim 40, wherein:
said electrons are transferred from said control gate to said floating gate during erasing of said non-volatile storage element.

42. A non-volatile storage device according to claim 41, wherein:
said floating gate has rounded edges.

43. A non-volatile storage device according to claim 40, further comprising:
a control circuit, said control circuit programs, erases and reads data in said non-volatile storage device, said control circuit causes said electrons to be transferred from said control gate to said floating gate.

44. A non-volatile storage device according to claim 40, further comprising:
a control circuit, said control circuit programs, erases and reads data in said non-volatile storage device, said control circuit causes said electrons to be transferred from said control gate to said floating gate during an erase process.

* * * * *